(12) United States Patent
Harada

(10) Patent No.: US 6,979,874 B2
(45) Date of Patent: Dec. 27, 2005

(54) SEMICONDUCTOR DEVICE AND METHOD OF MANUFACTURING THEREOF

(75) Inventor: Masana Harada, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 118 days.

(21) Appl. No.: 10/283,132

(22) Filed: Oct. 30, 2002

(65) Prior Publication Data

US 2003/0057482 A1 Mar. 27, 2003

Related U.S. Application Data

(62) Division of application No. 08/988,212, filed on Dec. 10, 1997, now Pat. No. 6,501,146.

(30) Foreign Application Priority Data

Jun. 18, 1997 (JP) .................................. 9-161042

(51) Int. Cl.[7] .................... H01L 27/095; H01L 29/80
(52) U.S. Cl. .................... 257/475; 257/283; 257/471; 257/622
(58) Field of Search .................... 257/155–156, 257/267–269, 260, 471–486, 622, 656, 280–284, 257/440–457; 438/570–571, 576–577, 581, 438/92

(56) References Cited

U.S. PATENT DOCUMENTS

| | | | |
|---|---|---|---|
| 4,982,260 A | 1/1991 | Chang et al. | |
| 5,109,256 A | 4/1992 | DeLong | 357/15 |
| 5,241,195 A | 8/1993 | Tu et al. | 257/476 |
| 5,278,443 A * | 1/1994 | Mori et al. | 257/475 |
| 5,365,102 A | 11/1994 | Mehrotra et al. | 257/475 |
| 5,612,567 A | 3/1997 | Baliga | 257/475 |
| 5,637,898 A * | 6/1997 | Baliga | 257/330 |
| 5,661,312 A * | 8/1997 | Weitzel et al. | 257/77 |
| 5,679,966 A | 10/1997 | Baliga et al. | 257/139 |
| 6,078,090 A * | 6/2000 | Williams et al. | 257/476 |
| 6,656,774 B1 * | 12/2003 | Chow et al. | 438/133 |

FOREIGN PATENT DOCUMENTS

| | | |
|---|---|---|
| JP | 3-24767 | 2/1991 |
| JP | 4-321274 | 11/1992 |
| JP | 5-63184 | 3/1993 |
| JP | 5-226638 | 9/1993 |

OTHER PUBLICATIONS

"Low-Loss Schottky Rectifier Utilizing Trench Sidewall as Junction-Barrier-Controlled Schottky Contact" Han-Soo Kim et al., *Jpn. J. Appl. Phys.*, vol. 34 (1995), pp. 913-916.

(Continued)

*Primary Examiner*—Ori Nadav
(74) *Attorney, Agent, or Firm*—McDermott Will & Emery LLP

(57) ABSTRACT

A plurality of p anode regions are formed at one surface of an $n^-$ substrate. A trench is formed in each p anode region. An ohmic junction region is formed between an anode metallic electrode and the p anode region. The p anode region has a minimum impurity concentration at a portion near the ohmic junction region which enables ohmic contact. A cathode metallic electrode is formed at the other surface of the $n^-$ substrate with an $n^+$ cathode region interposed. Accordingly, a semiconductor device which has an improved withstand voltage and in which the reverse recovery current is reduced can be obtained.

8 Claims, 31 Drawing Sheets

OTHER PUBLICATIONS

"High-Speed Low-Loss p-n Diode Having a Channel Structure", Y. Shimzu et al, IEEE Transactions on Electron Devices, vol. ED-31, No. 9, Sep. 1984, pp 1314-1319.

"High Current Characteristics of Asymmetrical p-I-n Diodes Having Low Forward Voltage Drops", M. Naito et al, IEEE Transactions on Electron Devices, vol. Ed-23, No. 8, Aug. 1976, pp. 945-949.

"The Merged P-I-N Schottky (MPS) Rectifier: A High voltage, High-Speed Power Diode", B. Jayant Baliga et al, IEDM 87, 1987, pp 658-661.

* cited by examiner

SEMICONDUCTOR DEVICE AND METHOD OF MANUFACTURING THEREOF

This application is a divisional application of U.S. patent application Ser. No. 08/988,212, filed Dec. 10, 1997 now U.S. Pat. No. 6,501,146.

BACKGROUND OF THE INVENTION

1. Field of the Invention

The present invention relates to a semiconductor device and a method of manufacturing a semiconductor device. The invention particularly relates to a semiconductor device which has a higher withstand voltage and in which the reverse recovery current is reduced, and a method of manufacturing such a semiconductor device.

2. Description of the Background Art

A semiconductor device such as an IGBT (Insulated Gate Bipolar Transistor) is applied to various inverter circuits as a switching element. In order to release the energy stored in an inductive load in the switching process and utilize it as the circulating current, a diode is connected in antiparallel with a main semiconductor device. Such a diode is especially referred to as a flywheel diode.

Excess carriers are stored in a diode in the forward bias state, that is, in the ON state. The stored excess carriers are released in the process of transition to the OFF state, that is, the reverse bias state. At this time, current flows in a direction opposite to the forward direction of the diode. This current is especially referred to as reverse recovery current which flows into a semiconductor device such as the IGBT, resulting in the loss. The excess carriers which constitute the reverse recovery current are, in this case, minority carriers or holes.

A diode in which the minority carriers are not stored is the Schottky diode. Description of the Schottky diode is given below referring to the figure. With reference to FIG. 54, at one surface of an n⁻ substrate 101, a silicon oxide film 107 is formed. An anode metallic electrode 105 is further formed via a Schottky junction region 104. At the other surface of n⁻ substrate 101, a cathode metallic electrode 106 is formed via an n⁺ cathode region 102.

In this structure, most current flowing through Schottky junction region 104 is constituted by the majority carriers. Therefore, no minority carrier is stored in n⁻ substrate 101, and the reverse recovery current is small. As a result, a high speed switching is possible. However, the withstand voltage in the reverse bias state depends on Schottky junction region 104. The withstand voltage is about 100V at most, and improvement of the withstand voltage is impossible.

In order to improve the withstand voltage, a structure has been used in which a pn junction is provided around the Schottky junction region, a depletion layer extending from the pn junction in the reverse bias state is utilized, and the withstand voltage is obtained. A first conventional diode having such a structure is described referring to the figure. With reference to FIG. 55, a plurality of p anode regions 103 are formed at one surface of n⁻ substrate 101. On the one surface of n⁻ substrate 101 including p anode regions 103, an anode metallic electrode 105 is formed. Schottky junction region 104 is formed between anode metallic electrode 105 and n⁻ substrate 101. On the other surface of n⁻ substrate 101, a cathode metallic electrode 106 is formed via n⁺ cathode region 102.

In this diode, a depletion layer extends from an interface between p anode regions 103 and n⁻ substrate 101 toward the n⁻ substrate particularly in the reverse bias state. In the vicinity of Schottky junction region 104, the depletion layers extending from the interfaces between the adjacent p anode regions 103 and n⁻ substrate 101 connect with each other, easing the electric field. As a result, the withstand voltage in the reverse bias state is improved compared with the Schottky diode.

A second conventional diode is described referring to the figure. With reference to FIG. 56, a plurality of p anode regions 103 are formed at one surface of n⁻ substrate 101. At regions between respective p anode regions 103, a p⁻ region 108 is formed. On p anode regions 103 and p⁻ region 108, anode metallic electrode 105 is provided. On the other surface of the n⁻ substrate, cathode metallic electrode 106 is formed via n⁺ cathode region 102.

In this diode, a depletion layer extends from an interface between p anode region 103 and n⁻ substrate 101 toward n⁻ substrate 101, and a depletion layer further extends from an interface between p⁻ region 108 and n⁻ substrate 101 toward n⁻ substrate 101, particularly in the reverse bias state. As a result, the withstand voltage is further improved compared with the diode shown in FIG. 55.

A third conventional diode disclosed in Japanese Patent Laying-Open No. 4-321274 is described referring to the figure. With reference to FIG. 57, a plurality of concave portions 206 are formed at one surface of a semiconductor substrate of one conductivity type 201. A semiconductor region of opposite conductivity type 204 is formed along an inner surface of each concave portion 206. A one electrode metal 205 is formed on one conductivity type semiconductor substrate 201 including the surface of concave portion 206. On the opposite side of one conductivity type semiconductor substrate 201, an ohmic electrode metal 203 is formed via a one conductivity type semiconductor 202 of low resistance. One conductivity type semiconductor substrate 201 and one electrode metal 205 constitute the Schottky barrier junction.

In this diode, a depletion layer extends from an interface between semiconductor region of opposite conductivity type 204 and semiconductor substrate of one conductivity type 201 toward one conductivity type semiconductor substrate 201 in the reverse bias state. At this time, the portion adjacent to the interface between one conductivity type semiconductor substrate 201 and one electrode metal 205 is sandwiched between the depletion layers. Accordingly, in a portion adjacent to one conductivity type semiconductor substrate 201 and one electrode metal 205, the electric field is eased and the withstand voltage is improved.

Next a fourth conventional diode disclosed in U.S. Pat. No. 4,982,260 is described. Referring to FIG. 58, on one surface of a first semiconductor substrate layer 502, a second semiconductor layer 506 is formed. At a main surface 508 of the second semiconductor layer 506, a plurality of trenches 512A–512F are formed. P⁺ regions 510A–510D as well as mesa regions 514A–514C are alternately provided between adjacent trenches. The depth of p⁺ regions 510A–510D is substantially identical to that of trenches 512A–512F. Oxide layers 522A–522F are respectively formed at respective inner surfaces of trenches 512A–512F. A metallic anode 518 is formed on main surface 508 of the second semiconductor layer 506. Schottky barrier regions 550A–550C are formed between metallic anode 518 and the second semiconductor layer 506. A cathode 504 is formed on the other surface of the first semiconductor substrate layer 502.

In this diode, a depletion layer extends from an interface between p⁺ regions 510A–510D and the second semiconductor layer 506 toward the second semiconductor layer 506 in the reverse bias state. The depletion layer extending from each interface is connected with adjacent depletion layers, and the withstand voltage of the diode is improved.

Another diode disclosed in U.S. Pat. No. 4,982,260 is described as a fifth conventional art using the figure. With reference to FIG. 59, on one surface of a first semiconductor substrate layer 702, a second semiconductor layer 706 is formed. A plurality of trenches 710A–710F are provided at a main surface of second semiconductor layer 706. At the bottoms of respective trenches 710A–710F, $p^+$ regions 720A–720F are provided. Respective trenches 710A–710F have their side surfaces at which oxide layers 722A–722J are formed. On the main surface of the semiconductor layer 706, a metallic anode 716 is formed. On the other surface of the first semiconductor substrate layer 702, a cathode 704 is formed.

In this diode, a depletion layer extends from an interface between $p^+$ regions 720A–720F and the second semiconductor layer 706 toward the second semiconductor layer 706. Each depletion layer is connected to adjacent depletion layers, and extends to still deeper region in the second semiconductor layer 706. As a result, the withstand voltage of the diode is further improved.

Problems of those conventional diodes described above are as follows.

In the diode shown in FIG. 55 presented as the first conventional art, holes as minority carriers are injected from p anode region 103 toward $n^-$ substrate 101 in the forward bias state. At this time, p anode region 103 includes a relatively large number of impurities, so that still more holes are injected into $n^-$ substrate 101 and stored therein. Therefore, the reverse recovery current increases in the process of transition from the forward bias state to the zero bias state.

In the diode shown in FIG. 56 presented as the second conventional art, p anode region 103 has a relatively high concentration, so that still more holes are injected from p anode region 103 into $n^-$ substrate 101 in the forward bias state. As a result, the reverse recovery current increases.

When the potential between the metallic anode 716 and cathode 704 in the reverse bias state becomes higher, a depletion layer extends from an interface between $p^-$ region 108 and $n^-$ substrate 101 toward $n^-$ substrate 101, and the depletion layer further extends toward $p^-$ region 108. If the edge of the depletion layer has contact with anode metallic electrode 105, the dielectric breakdown could occur.

In the diode shown in FIG. 57 as the third conventional art, after concave portion 206 is formed at one conductivity type semiconductor substrate 201, opposite conductivity type semiconductor region 204 is formed along the inner surface of concave portion 206. Therefore, the concentration of impurities is relatively high in the entire semiconductor region of opposite conductivity type 204. As a result, still more holes are injected from opposite conductivity type semiconductor region 204 into one conductivity type semiconductor substrate 201 in the forward bias state. As a result, the reverse recovery current increases.

In the diode shown in FIG. 58 as the fourth conventional art, the concentration of impurities in the formed $p^+$ regions 510A–510D is relatively high. Still more holes are injected from the $p^+$ regions into the second semiconductor layer in the forward bias state. As a result, the reverse recovery current increases.

In the diode shown in FIG. 59 as the fifth conventional art, the concentration of impurities in the formed $p^+$ regions 720A–720F is relatively high, and the reverse recovery current also increases.

SUMMARY OF THE INVENTION

The invention is made to solve the problems above. One object of the present invention is to provide a semiconductor device which has an improved withstand voltage and in which the reverse recovery current is reduced. Another object of the present invention is to provide a method of manufacturing such a semiconductor device.

A semiconductor device according to a first aspect of the invention includes a semiconductor substrate of a first conductivity type, a plurality of trench portions, a plurality of impurity regions of a second conductivity type, and a first electrode layer. The plurality of trench portions are selectively formed at a first main surface of the semiconductor substrate. The plurality of impurity regions of the second conductivity type are in contact with at least bottom surfaces of respective trench portions and are formed deeper than respective trench portions. The first electrode layer is formed on the first main surface of the semiconductor substrate. The first electrode layer and a region of the first conductivity type of the semiconductor substrate constitute a Schottky junction at the first main surface. The first electrode layer is in ohmic contact with the impurity region at a prescribed junction surface. Each impurity region has a minimum impurity concentration which enables the ohmic contact with the first electrode layer at a portion near the prescribed junction surface, and has an impurity concentration still lower than the minimum impurity concentration which enables the ohmic contact at a portion other than the portion near the prescribed junction surface.

In this structure, minority carriers are injected from the impurity region in ohmic contact with the first electrode layer into the semiconductor substrate in the forward bias state in which one prescribed potential is applied to the first electrode layer and the semiconductor substrate respectively. An amount of injected minority carriers depends on an impurity concentration in the impurity region. In this case, the impurity region has a minimum impurity concentration which enables the ohmic contact with the first electrode layer at a portion adjacent to a prescribed junction surface, and has an impurity concentration still lower than the minimum impurity region at the other portion. Accordingly, an amount of minority carriers injected from the impurity region into the semiconductor substrate and stored therein is reduced. As a result, the reverse recovery current flowing into the semiconductor device in a reverse bias direction in the process of transition from the forward bias state to the reverse bias state.

A depletion layer extends from an interface between the impurity region and the semiconductor substrate toward the semiconductor substrate in the reverse bias state in which another prescribed potential is applied to the first electrode layer and the semiconductor substrate respectively. At this time, at a region adjacent to the Schottky junction, the electric field is eased since depletion layers extending from adjacent impurity regions are connected with each other. The depletion layer extends deeper in the semiconductor substrate since each impurity region is formed deeper than the trench portion. Therefore, the distance from the first electrode layer to the edge of the depletion layer increases. The withstand voltage of a semiconductor substrate in the reverse bias state is thus improved.

Preferably, each impurity region is formed to be in contact with both sides of the trench portion as well as the first main surface in the vicinity of the both sides. A prescribed junction surface is located at, at least the first main surface of the impurity region.

In this case, each impurity region has a trench portion formed therein, so that the impurity region is substantially located at a portion near the junction with the semiconductor substrate. An impurity concentration of the impurity region formed at the semiconductor substrate gradually decreases from the portion near the center of the first main surface of the impurity region to an interface between the impurity region and the semiconductor substrate. A portion having a relatively high impurity concnetration is removed by forming the trench portion in the impurity region. An impurity concentration of a portion remaining substantially as an impurity region is relatively low. Therefore, an amount of minority carriers injected from the impurity region into the semiconductor substrate and stored therein in the forward bias state is further reduced. As a result, the reverse recovery current is further reduced.

Preferably, insulator is embedded in each trench portion.

In this case, the first electrode layer is in ohmic contact with the impurity region only at the first main surface. The area of the ohmic contact between the first electrode layer and the impurity region is reduced. An amount of minority carriers injected from the impurity region into the semiconductor substrate and stored therein in the forward bias state is further reduced. As a result, further reduction of the reverse recovery current is achieved.

Still preferably, an insulating layer formed at surfaces of both sides of the trench portion is included. Each impurity region is formed to be in contact with only a portion near a bottom surface of each trench portion, and a prescribed junction surface is located at a bottom surface of each trench portion.

In this case, the impurity region is formed within the semiconductor substrate to be in contact with only a portion near the bottom surface of the trench portion. In other words, the impurity region is formed at a position distant from the first main surface of the semiconductor substrate. A depletion layer extends from an interface between the impurity region and the semiconductor substrate toward the semiconductor substrate to a still deeper position in the reverse bias state. The electric field of a portion near the Schottky junction is further eased. As a result, the withstand voltage of the semiconductor device in the reverse bias state is improved.

A semiconductor device according to the second aspect of the invention includes a semiconductor substrate of a first conductivity type, a plurality of trench portions, a conductor, an impurity region of a second conductivity type, and a first electrode layer. The plurality of trench portions are selectively formed at a first main surface of the semiconductor substrate. The conductor is embedded in each trench portion with a first insulating layer therebetween. The impurity region of the second conductivity type is formed at a region between respective trench portions of the first main surface of the semiconductor substrate, in contact with at least one of the opposite sides of adjacent trench portions, and has a depth deeper than that of the trench portion. The first electrode layer is formed on the first main surface of the semiconductor substrate. The first electrode layer is in ohmic contact with each impurity region at the first main surface. Each impurity region has a minimum impurity concentration which enables ohmic contact with the first electrode layer at a portion near the first main surface, and has an impurity concentration still lower than the minimum impurity region which enables ohmic contact, at a portion other than that near the first main surface.

In this structure, minority carriers are injected from the impurity region in ohmic contact with the first electrode layer into the semiconductor substrate in the forward bias state in which one prescribed potential is applied to the first electrode layer and the semiconductor substrate respectively. An amount of injected minority carriers depends on an impurity concentration of the impurity region. In this case, the impurity region has the minimum impurity concentration which enables ohmic contact with the first electrode layer at the first main surface, and has an impurity concentration still lower than the minimum impurity concentration at the other portion. Accordingly, an amount of minority carriers injected from the impurity region into the semiconductor substrate and stored therein is reduced. As a result, the reverse recovery current flowing into the semiconductor device in the reverse bias direction in the transition from the forward bias state to the reverse bias state is reduced.

A depletion layer extends from an interface between the impurity region and the semiconductor substrate toward the semiconductor substrate in the reverse bias state in which the other prescribed potential is applied to the first electrode layer and the semiconductor substrate respectively. Since the impurity region has its depth larger than that of the trench portion, the depletion layer further extends toward the first main surface at a portion near the region in which the interface and the side of the trench portion are in contact with each other. Accordingly, the depletion layer further extends at a portion adjacent to both sides of the trench portion, and the withstand voltage of the semiconductor device in the reverse bias state is improved.

Preferably, the impurity region is formed to be in contact with the opposite sides of adjacent trench portions, and the first electrode layer and a region of the first conductivity type of the semiconductor substrate form the Schottky junction at the first main surface.

In this case, a region in which the impurity region is formed is reduced. An amount of minority carriers injected from the impurity region into the semiconductor substrate and stored therein in the forward bias state is further reduced. As a result, the reverse recovery current flowing in the semiconductor device in the reverse bias direction in transition from the forward bias state to the reverse bias state is reduced.

Preferably, each impurity region is formed at both sides of each trench portion to be in contact with one side of each trench portion. The first electrode layer and a region of the first conductivity type of the semiconductor substrate form the Schottky junction at the first main surface.

In this case, an impurity region formed to be in contact with the side of each trench portion is located in a region sandwiched between respective trench portions. The first conductivity type region of the semiconductor substrate sandwiched between impurity regions and the first electrode layer form the Schottky junction. Therefore, a region in which the impurity region is formed is further reduced. As a result, an amount of minority carriers injected from the impurity region into the semiconductor substrate and stored therein in the forward bias state is further reduced.

A depletion layer extends from an interface between the impurity region located between respective trench portions and the semiconductor substrate toward the semiconductor substrate in the reverse bias state. A depletion layer extending from the portion between respective trench portions is easily connected with an adjacent depletion layer. As a result, the reverse recovery current flowing in the semiconductor device in the reverse bias direction in the transition from the forward bias state to the reverse bias state is reduced. Further, the withstand voltage of the semiconductor device in the reverse bias state is improved.

Preferably, a second insulating layer formed on each conductor which insulates the first electrode layer from each conductor, and an electrode portion electrically connected with each conductor are included.

In this case, voltage of at least a prescribed threshold voltage is applied to the electrode portion. At this time, the conductivity type of the impurity region near the second insulating layer of each trench portion is reversed and a channel region is formed. At the same time that minority carriers are injected from the impurity region toward the semiconductor substrate, carriers of a conductivity type opposite to that of the minority carriers reach the first electrode layer through the channel region. The carriers of the opposite conductivity type which reach the first electrode layer again couple with the minority carriers in the impurity region and disappear. Accordingly, an amount of the minority carriers injected from the impurity region into the semiconductor substrate and stored therein is reduced. Reduction of the reverse recovery current flowing in the semiconductor device in the reverse bias direction in transition from the forward bias state to the reverse bias state is achieved.

Voltage of a prescribed threshold voltage or less is applied in the reverse bias state. The absolute value of the voltage is approximately equivalent to that of the voltage applied in the forward bias state. At this time, a depletion layer extends from an interface between the second insulating layer of each trench portion and the semiconductor substrate toward the semiconductor substrate. A depletion layer further extends from an interface between the impurity region and the semiconductor substrate toward the semiconductor substrate. These depletion layers easily connect with adjacent depletion layers. As a result, the withstand voltage of the semiconductor device in the reverse bias state is improved.

Preferably, the impurity region is formed to be in contact with the opposite sides of adjacent trench portions, and includes a second insulating layer formed on each conductor and insulates the first electrode layer from each conductor, and includes an electrode portion electrically connected with each conductor.

In this case, the impurity region is formed at a region between respective trench portions. In the forward bias state, voltage of at least a prescribed threshold voltage is applied to the electrode portion. At this time, the conductivity type of the impurity region near the second insulating layer of each trench portion is reversed and a channel region is formed. At the same time that minority carriers are injected from the impurity region toward the semiconductor substrate, carriers of a conductivity type opposite to that of the minority carriers reach the first electrode layer again through the channel region. Carriers of the opposite conductivity type which reach the first electrode layer again couple with minority carriers in the impurity region and disappear. As a result, an amount of minority carriers injected from the impurity region into the semiconductor substrate and stored therein is reduced.

Voltage of a prescribed threshold voltage or less is applied in the reverse bias state. At this time, in addition to a depletion layer extending from an interface between the impurity region and the semiconductor substrate toward the semiconductor substrate, a depletion layer extends from an interface between the second insulating layer of each trench portion and the semiconductor substrate toward the semiconductor substrate. As a result, reduction of the reverse recovery current flowing in the semiconductor device in the reverse direction in transition from the forward bias state to the reverse bias state, as well as improvement of the withstand voltage of the semiconductor device in the reverse bias state are achieved.

Preferably, the first electrode layer is formed of aluminum, and the minimum impurity concentration which enables ohmic contact with the first electrode layer is $1 \times 10^{16} – 1 \times 10^{17}/cm^3$.

In this case, ohmic contact can be formed easily as desired.

A method of manufacturing a semiconductor device according to the third aspect of the invention includes following steps. Into a first main surface of a semiconductor substrate of a first conductivity type, impurities of a second conductivity type are selectively introduced. A plurality of impurity regions are formed by heat treatment. A Schottky junction portion is formed at the first main surface of a region of the first conductivity type of the semiconductor substrate. A trench portion is formed in each impurity region by the anisotropic etching. A first electrode layer is formed on the first main surface of the semiconductor substrate such that it is in ohmic contact with the impurity region at, at least the first main surface.

This manufacturing method allows an impurity concentration of the impurity region formed at the semiconductor substrate to be gradually reduced from the portion near the center of the semiconductor substrate of the first main surface toward the interface with the semiconductor substrate. By forming the trench portion at the impurity region, a region having a relatively high impurity concentration is removed from the impurity region. Therefore, an impurity region actually formed corresponds to a portion having a relatively low impurity concentration located at a portion near the interface with the semiconductor substrate. The impurity region is in ohmic contact with the first electrode layer at, at least the first main surface. An amount of minority carriers injected from the impurity region into the semiconductor substrate in the forward bias state is thus reduced. A semiconductor device in which the reverse recovery current flowing in the reverse bias direction in transition from the forward bias state to the zero bias state is reduced can be obtained.

The method further includes a step of embedding an insulator in each trench portion.

In this case, the first electrode layer is in ohmic contact with the impurity region only at the first main surface. Accordingly, an area of a portion in which the first electrode layer and the impurity region are in ohmic contact with each other is reduced. Further, an amount of minority carriers injected from the impurity region into the semiconductor substrate and stored therein in the forward bias state is reduced. As a result, a semiconductor device in which the reverse recovery current is further reduced can be obtained.

Preferably, aluminum is used for the first electrode layer, and the impurity region is formed such that it has an impurity concentration of $1 \times 10^{16} – 1 \times 10^{17}/cm^3$ at a portion near the junction surface with the first electrode layer.

In this case, the impurity region is formed to have a minimum impurity concentration which enables ohmic contact with the first electrode layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
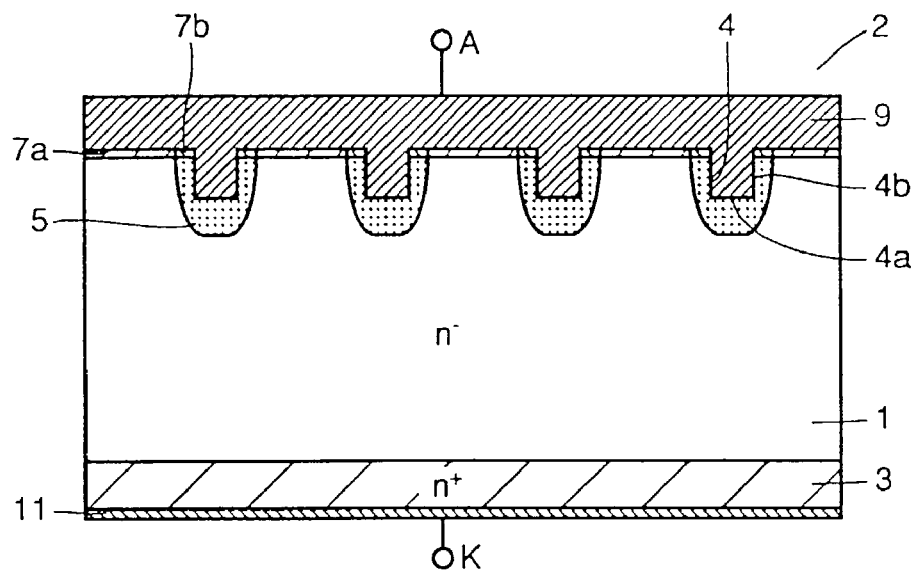
FIGS. 1 and 2 respectively show cross sectional views of diodes according to the first and second embodiments of the invention.

A diode according to the first embodiment of the invention is described using the accompanying figure. Referring to FIG. 1, a plurality of p anode regions 5 are formed at one surface of an $n^-$ substrate 1. Trenches 4 are respectively formed at p anode regions 5. An anode metallic electrode 9 is formed on the one surface of $n^-$ substrate 1 to fill trenches 4. A Schottky junction region 7a formed of platinum silicide is formed at an interface between anode metallic electrode 9 and $n^-$ substrate 1. On the other surface of $n^-$ substrate 1, a cathode metallic electrode 11 is formed with an $n^+$ cathode region 3 therebetween.

Each p anode region 5 is formed by introduction of a p type impurity into $n^-$ substrate 1 and by heat treatment. At the same time that the impurity is thermally diffused from the surface of $n^-$ substrate 1 toward its inside, the impurity is also thermally diffused from the surface of $n^-$ substrate 1 toward a portion therearound. An initial amount of introduction of an impurity, a condition of heat treatment and the like are selected such that an impurity concentration of an impurity region at the surface of $n^-$ substrate 1 has a minimum value which enables ohmic contact with anode metallic electrode 9.

Accordingly, an impurity concentration in the impurity region has the maximum value at a portion near the center of the surface of $n^-$ substrate 1, and the concentration decreases to have a lower value toward the inside of $n^-$ substrate 1. At a portion near the center of each impurity region, trench 4 is formed. A region having a relatively low impurity concentration at a portion near an interface with $n^-$ substrate 1 ultimately becomes p anode region 5. For example, when anode metallic electrode 9 is formed of aluminum, an impurity concentration of p anode region 5 in ohmic contact with anode metallic electrode 9 is $1 \times 10^{16}$–$1 \times 10^{17}/cm^3$.

An operation is next described. Description is given concerning a forward bias state in which a positive potential is applied to anode metallic electrode 9 and a negative potential is applied to cathode metallic electrode 11. In the forward bias state, holes as minority carriers are injected from p anode region 5 which is in ohmic contact with anode metallic electrode 9 into $n^-$ substrate 1. At the same time, electrons are injected from $n^+$ cathode region 3 into $n^-$ substrate 1. Current flows between anode metallic electrode 9 and cathode metallic electrode 11 to generate the ON state. At this time, since the impurity concentration of p anode region 5 is relatively low, an amount of holes injected from p anode region 5 into $n^-$ substrate 1 and stored therein decreases.

Next, the reverse bias state between anode metallic electrode 9 and cathode metallic electrode 11 is produced. In transition to the OFF state, the minority carriers stored in $n^-$ substrate 1 flow in the reverse bias direction, that is, from cathode metallic electrode 11 toward anode metallic electrode 9 as the reverse recovery current. In this case, the amount of holes as the minority carriers stored in $n^-$ substrate 1 is small, so that the reverse recovery current of diode 2 is reduced.

When a negative potential and a positive potential are respectively applied to anode metallic electrode 9 and cathode metallic electrode 11, that is, in the reverse bias state, a depletion layer extends from an interface between each p anode region 5 and $n^-$ substrate 1 toward $n^-$ substrate 1. At this time, a portion near Schottky junction region 7a is sandwiched between depletion layers respectively extending from adjacent p anode regions 5. The electric field of a portion near Schottky junction region 7a is thus eased. As a result, withstand voltage of diode 2 in the reverse bias state is improved.

Second Embodiment

Figure 2:
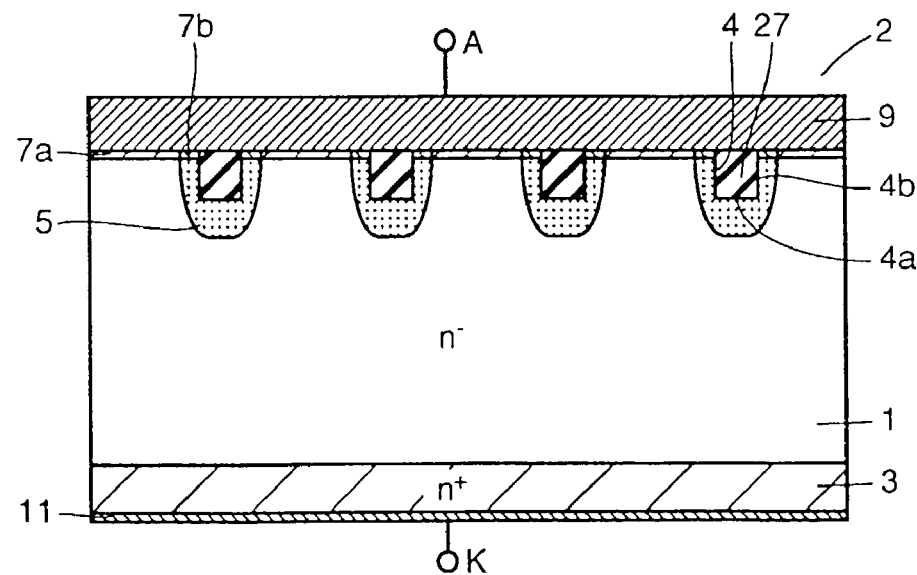

A diode according to the second embodiment of the invention is described with reference to drawings. Referring to FIG. 2, a silicon oxide film 27 is embedded in trench 4 formed at each p anode region 5. Structural components other than above are similar to those of the diode shown in FIG. 1 described in the first embodiment, identical components are indicated by the same reference characters and detailed description thereof is omitted.

Figure 3:
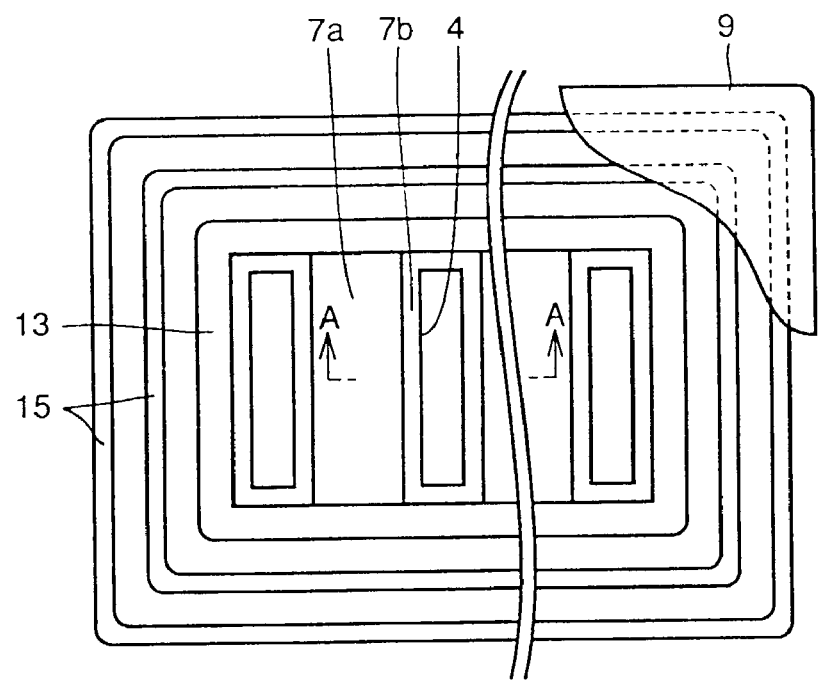
FIG. 3 shows a plan view of the diode shown in FIG. 2 according to the second embodiment.

A two dimensional structure of the diode shown in FIG. 2 is illustrated in FIG. 3 as one example. Referring to FIG. 3, a p anode region is formed around each trench 4, and ohmic junction region 7b between the p anode region and the anode metallic electrode 9 is located. A peripheral p region 13 is formed therearound, and a guard ring 15 for improving insulation property is formed. It is noted that FIG. 2 shows a cross section taken along A—A shown in FIG. 3.

The operation is next described. In the diode described in the first embodiment, anode metallic electrode 9 is embedded in trench 4. The property of distribution of the impurity concentration in p anode region 5 allows anode metallic electrode 9 to be in ohmic contact with p anode region 5 also at the side of trench 4 near ohmic junction region 7b.

According to this embodiment, silicon oxide film 27 is embedded in trench 4. Anode metallic electrode 9 is in ohmic contact with p anode region 5 only at ohmic junction region 7b. An area in which anode metallic electrode 9 is in ohmic contact with p anode region 5 is thus decreased. An amount of holes injected from p anode region 5 into n⁻ substrate 1 to be stored therein in the forward bias state is decreased. As a result, the reverse recovery current of diode 2 reduces.

Third Embodiment

Figure 4:
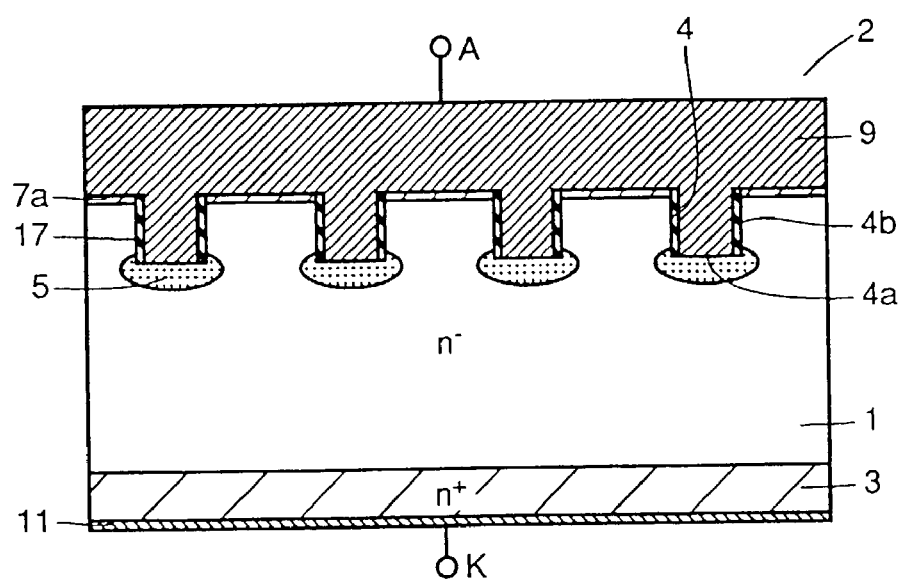
FIGS. 4 and 5 respectively show cross sectional views of diodes according to the third and fourth embodiments of the invention.

A diode according to the third embodiment of the invention is described using the accompanying figure. Referring to FIG. 4, a plurality of trenches 4 are formed at one surface of n⁻ substrate 1. A silicon oxide film 17 is formed at a side 4b of each trench 4. P anode region 5 is formed to be in contact with a bottom surface 4a of each trench 4. Anode metallic electrode 9 is formed on n⁻ substrate 1 to fill trench 4. Schottky junction region 7a is provided between anode metallic electrode 9 and n⁻ substrate 1. Anode metallic electrode 9 and p anode region 5 are in ohmic contact with each other at bottom surface 4a of trench. A cathode metallic electrode 11 is formed on the other surface of n⁻ substrate 1 with n⁺ cathode region 3 therebetween.

Each p anode region 5 is formed by the thermal diffusion of the p-type impurity introduced into bottom surface 4a of trench as described in the first embodiment. An amount of introduction of the impurity and a condition of the heat treatment are selected such that the value of the impurity concentration is minimum at trench bottom surface 4a which enables the ohmic contact with anode metallic electrode 9. In each p anode region 5 thus formed, the impurity concentration is highest at the portion near trench bottom surface 4a, and at other portions, the impurity concentration is lower than that concentration.

An operation is next described. An operation of a diode according to this embodiment is almost similar to that described in the first and second embodiments. First in the forward bias state, holes that are minority carriers are injected from each p anode region 5 into n⁻ substrate 1. At this time, p anode region 5 has the minimum impurity concentration at trench bottom surface 4a which enables the ohmic contact with anode metallic electrode 9. Those portions other than trench bottom surface 4a have an impurity concentration still lower than the minimum concentration. Accordingly, an amount of holes injected into n⁻ substrate 1 and stored therein is decreased. As a result, reduction of the reverse recovery current of diode 2 can be achieved.

In the reverse bias state, a depletion layer extends from an interface between p anode region 5 and n⁻ substrate 1 toward n⁻ substrate 1. P anode region 5 is formed by introduction of an impurity into bottom surface 4a of trench 4 which is formed in advance and by thermal diffusion thereof. Therefore, each p anode region 5 is located deeper, that is, located at a portion more distant from the surface of n⁻ substrate 1. Since the distance from the edge of the depletion layer to anode metallic electrode 9 is increased, the electric field therebetween is eased. As a result, the withstand voltage of diode 2 in the reverse bias state are improved.

Fourth Embodiment

Figure 5:
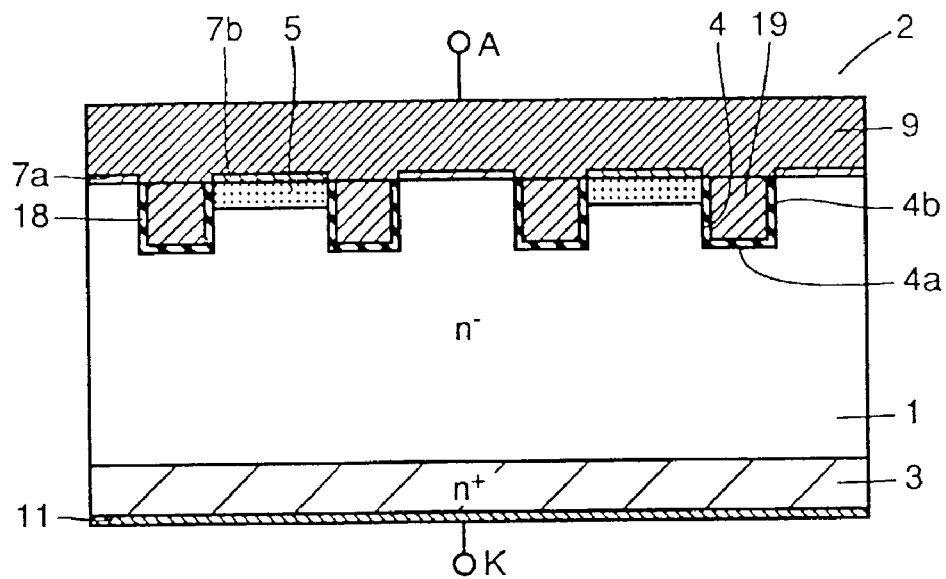

A diode according to the fourth embodiment of the invention is described using the figure. Referring to FIG. 5, a plurality of trenches 4 are formed at one surface of n⁻ substrate 1. The surface of each trench 4 is covered with a silicon oxide film 18. A doped polysilicon film 19 is further embedded therein. P anode region 5 and Schottky junction region 7a are alternately formed at n⁻ substrate 1 between respective trenches 4. Anode metallic electrode 9 is formed on the surface of n⁻ substrate 1. Ohmic junction region 7b is formed between anode metallic electrode 9 and p anode region 5. Cathode metallic electrode 11 is formed on the other surface of n⁻ substrate 1 having n⁺ cathode region 3 therebetween.

Figure 6:
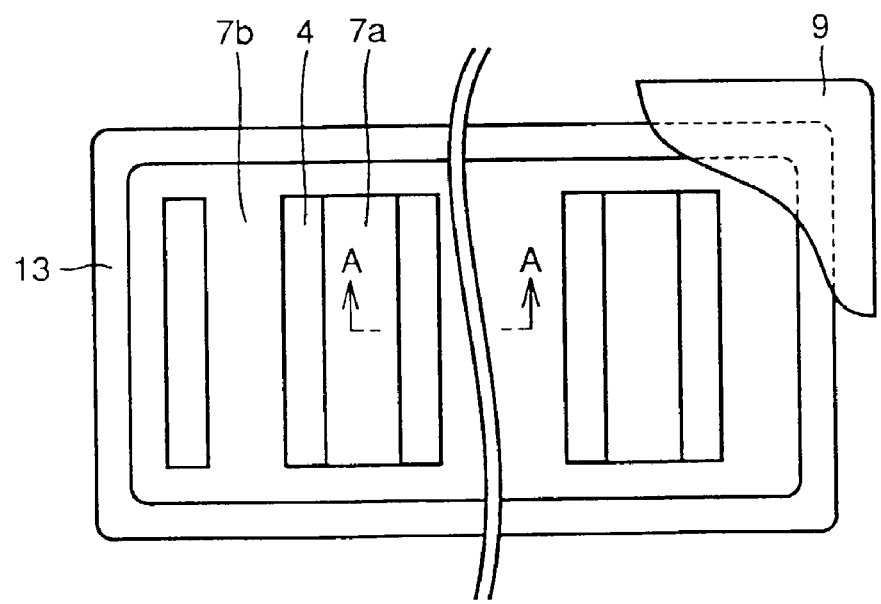
FIG. 6 shows a plan view of the diode shown in FIG. 5 according to the fourth embodiment.

An exemplary two-dimensional structure of diode 2 shown in FIG. 5 is provided in FIG. 6. Referring to FIG. 6, Schottky junction region 7a between anode metallic electrode 9 and n⁻ substrate 1 is formed between adjacent trenches 4. Ohmic junction region 7b between anode metallic electrode 9 and the p anode region is formed to surround trench 4 and Schottky junction region 7a. In addition, a peripheral p region 13 is formed therearound. FIG. 5 shows a cross section along A—A in FIG. 6.

Each p anode region 5 is formed by introducing the p type impurity into the surface of n⁻ substrate 1 and applying heat treatment thereto. An amount of the introduced impurity as well as a condition of the heat treatment are selected such that the impurity concentration is minimum at the surface of n⁻ substrate 1 which enables ohmic contact with anode metallic electrode 9, and such that the depth is smaller than that of trench 4. Each p anode region 5 has the maximum impurity concentration at the surface of n⁻ substrate 1, and has an impurity concentration lower than that concentration at other portion.

An operation is next described. In the forward bias state, holes which are minority carriers are injected from p anode region 5 into n⁻ substrate 1. At this time, the impurity concentration of p anode region 5 is minimum which enables the ohmic contact with anode metallic electrode 9 at the surface of n⁻ substrate 1. Therefore, the amount of holes injected into n⁻ substrate 1 and stored therein decreases. As a result, the reverse recovery current of diode 2 is reduced.

In the reverse bias state, a depletion layer extends from an interface between each p anode region 5 and n⁻ substrate 1 toward n⁻ substrate 1. The depth of each p anode region 5 is smaller than that of trench 4, and the depletion layer extends toward the surface of n⁻ substrate 1 at a portion in which the interface between p anode region 5 and n⁻ substrate 1 is in contact with the side of trench 4b. The depletion layer thus extends further near the side of trench 4b. The withstand voltage of diode 2 in the reverse bias state is thus improved.

Fifth Embodiment

Figure 7:
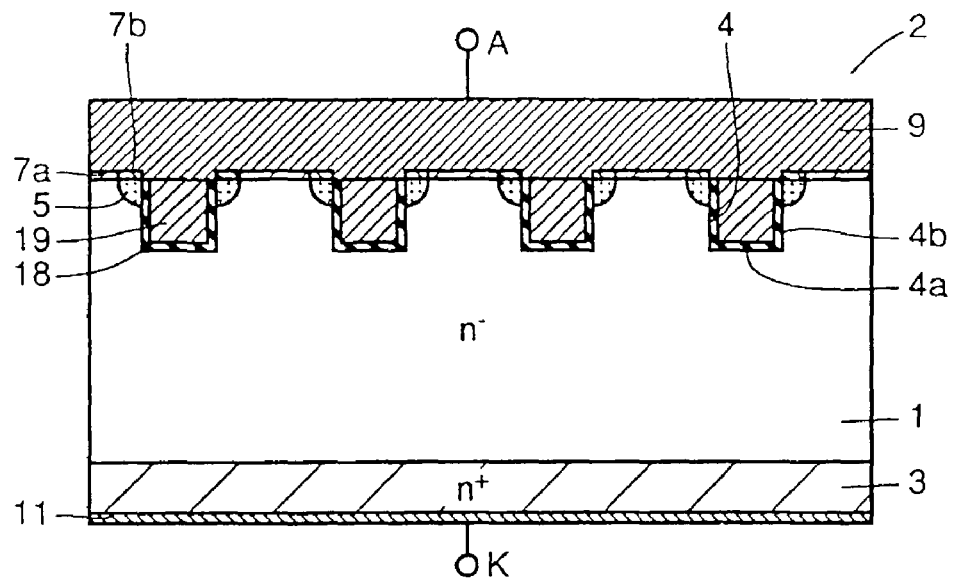
FIGS. 7–9 respectively show cross sectional views of diodes according to the fifth to the seventh embodiments of the invention.

Referring to the figure, a diode according to the fifth embodiment of the invention is described. With reference to FIG. 7, a plurality of trenches 4 are formed at one surface of $n^-$ substrate 1. A surface of each trench 4 is covered with silicon oxide film 18, and doped polysilicon film 19 is embedded therein. A plurality of p anode regions 5 are formed to be in contact with the side 4b of trench 4. Anode metallic electrode 9 is formed on the surface of $n^-$ substrate 1. Ohmic junction region 7b is provided between anode metallic electrode 9 and each p anode region 5. Further, Schottky junction region 7a is formed between anode metallic electrode 9 and $n^-$ substrate 1. On the other surface of $n^-$ substrate 1, cathode metallic electrode 11 is formed with $n^+$ cathode region 3 therebetween.

Each p anode region 5 has the minimum impurity concentration which enables the ohmic contact with anode metallic electrode 9 at the surface of $n^-$ substrate 1, and has an impurity concentration lower than the minimum concentration at other portions.

Next an operation is described. In the forward bias state, holes which are minority carriers are injected from each p anode region 5 into $n^-$ substrate 1. At this time, the impurity concentration of p anode region 5 only enables the ohmic contact with anode metallic electrode 9 at the surface of $n^-$ substrate 1. The amount of holes injected into $n^-$ substrate 1 and stored therein is decreased. As a result, the reverse recovery current of diode 2 is reduced.

In the reverse bias state, a depletion layer extends from an interface between each p anode region 5 and $n^-$ substrate 1 toward $n^-$ substrate 1. P anode region 5 is located at side 4b of trench 4, so that adjacent depletion layers are easily connected with each other. The electric field near Schottky junction region 7a is thus eased. As a result, the withstand voltage of diode 2 in the reverse bias state is improved.

Sixth Embodiment

Figure 8:
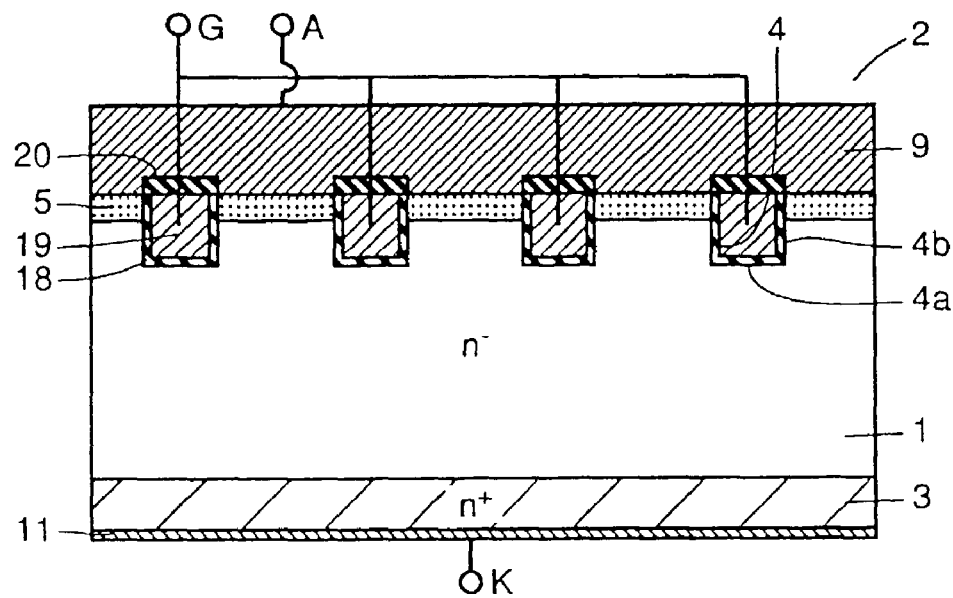

A diode according to the sixth embodiment is described using the attached figure. Referring to FIG. 8, a plurality of trenches 4 are formed at one surface of $n^-$ substrate 1. Each trench 4 is covered with silicon oxide film 18, and doped polysilicon film 19 is further embedded therein. P anode region 5 is formed at $n^-$ substrate 1 between adjacent trenches 4. Anode metallic electrode 9 is formed on p anode region 5. Each p anode region 5 is in ohmic contact with anode metallic electrode 9. Anode metallic electrode 9 and doped polysilicon film 19 are insulated by silicon oxide film 20. Doped polysilicon films 19 embedded in respective trenches 4 are electrically connected with each other and constitute a gate outgoing electrode G. Cathode metallic electrode 11 is formed on the other surface of $n^-$ substrate 1 with $n^+$ cathode region 3 therebetween.

Each p anode region 5 has the minimum impurity concentration which enables the ohmic contact with anode metallic electrode 9 at the surface of $n^-$ substrate 1, and has an impurity concentration lower than the minimum concentration at the other portions.

An operation is described below. In the forward bias state, a voltage of at least a prescribed threshold voltage is applied to gate outgoing electrode G. At this time, the conductivity type of p anode region 5 near silicon oxide film 18 becomes opposite, and a channel region of n type is formed. At the same time that holes that are minority carriers are injected from p anode region 5 into $n^-$ substrate 1, electrons travel from $n^-$ substrate 1 through the channel region to anode metallic electrode 9. The electrons which arrive at anode metallic electrode 9 are coupled with the holes in p anode region 5 again and disappear. The amount of holes which are injected from p anode region 5 into $n^-$ substrate 1 and stored therein decreases. As a result, the reverse recovery current of diode 2 is reduced.

In the reverse bias state, a voltage of at most a prescribed threshold voltage is applied to gate outgoing electrode G. At this time, a depletion layer extends from an interface between silicon oxide film 18 and $n^-$ substrate 1 toward $n^-$ substrate 1. A depletion layer also extends from an interface between p anode region 5 and $n^-$ substrate 1. These depletion layers are easily connected with adjacent depletion layers. The withstand voltage of diode 2 in the reverse bias state is further improved.

Seventh Embodiment

Figure 9:
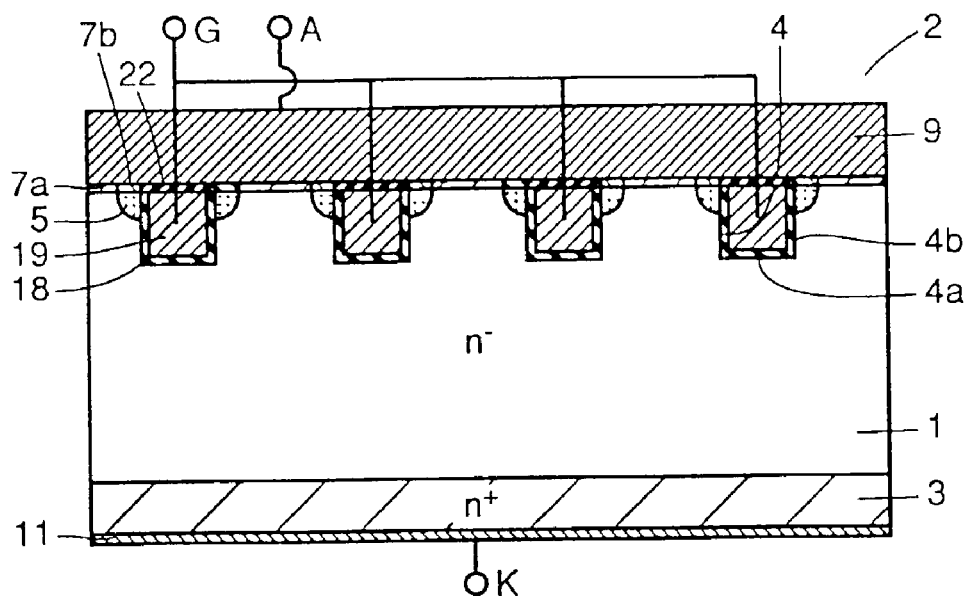

A diode according to the seventh embodiment is described using the figure. Referring to FIG. 9, doped polysilicon film 19 embedded in each trench 4 and anode metallic electrode 9 are insulated by a silicon oxide film 22. Doped polysilicon films 19 embedded in respective trenches 4 are electrically connected with each other and constitute gate outgoing electrode G. The structure is similar to that of the diode in FIG. 7 described in the fifth embodiment except that described above. The same components are indicated by the same reference characters and detailed description thereof is omitted.

An operation is described below. In the forward bias state, a voltage having at least a prescribed threshold voltage is applied to gate outgoing electrode G. At this time, the conductivity type of p anode region 5 near silicon oxide film 18 becomes opposite, and a channel region of n type is formed. Holes that are minority carriers are injected from p anode region 5 toward $n^-$ substrate 1. At the same time, electrons travel from $n^-$ substrate 1 through the channel region to arrive at anode metallic electrode 9. The electrons which arrive at anode metallic electrode 9 are coupled with holes in p anode region 5 again and disappear. The amount of holes injected from p anode region 5 into $n^-$ substrate 1 and stored therein is thus decreased. The reverse recovery current of diode 2 is thus reduced.

In the reverse bias state, a voltage having at most a prescribed threshold voltage is applied to gate outgoing electrode G. At this time, a depletion layer extends from an interface between silicon oxide film 18 and $n^-$ substrate 1 toward $n^-$ substrate 1. At the same time, a depletion layer also extends from an interface between p anode region 5 located to be in contact with side 4b of each trench 4 and $n^-$ substrate 1. Adjacent depletion layers easily connect with each other, and the electric field is eased. As a result, the withstand voltage of diode 2 in the reverse bias state is improved.

Eighth Embodiment

According to the eighth embodiment, a method of manufacturing a diode shown in FIG. 1 and described in the first embodiment is described using the figures.

Figure 10:
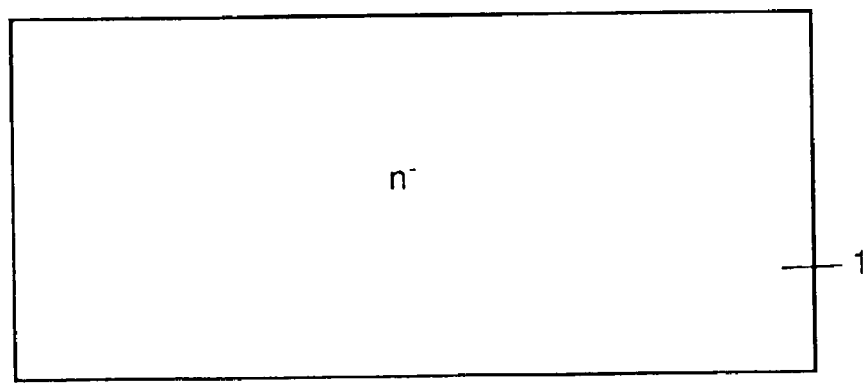
FIG. 10 is a cross sectional view showing one step of a method of manufacturing a diode according to the eighth embodiment of the invention.
Figure 11:
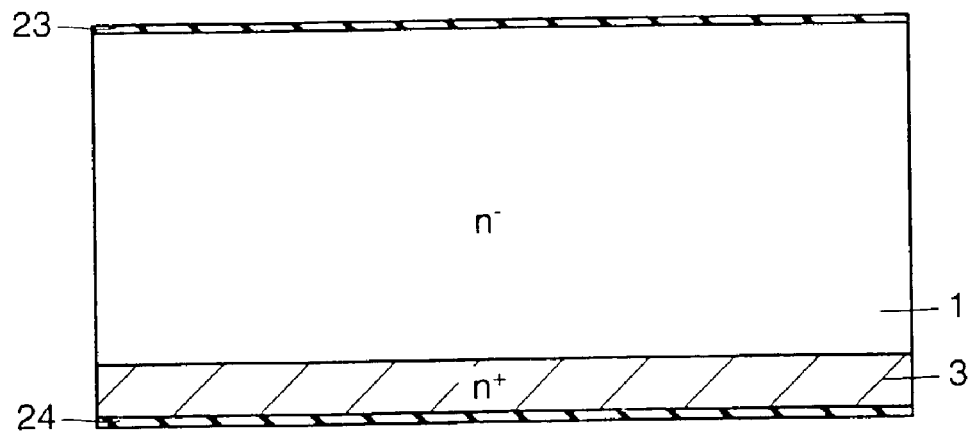
FIGS. 11–16 are cross sections respectively showing steps in the order of execution according to the eighth embodiment.

$N^+$ cathode region 3 is formed as shown in FIG. 11 by the ion implantation of an n type impurity into the entire surface of $n^-$ substrate 1 shown in FIG. 10 and by the thermal diffusion thereof. Silicon oxide film 23 on the surface of $n^-$ substrate 1 as well as silicon oxide film 24 on the surface of $n^+$ cathode region 3 are respectively formed by the thermal oxidation.

Figure 12:
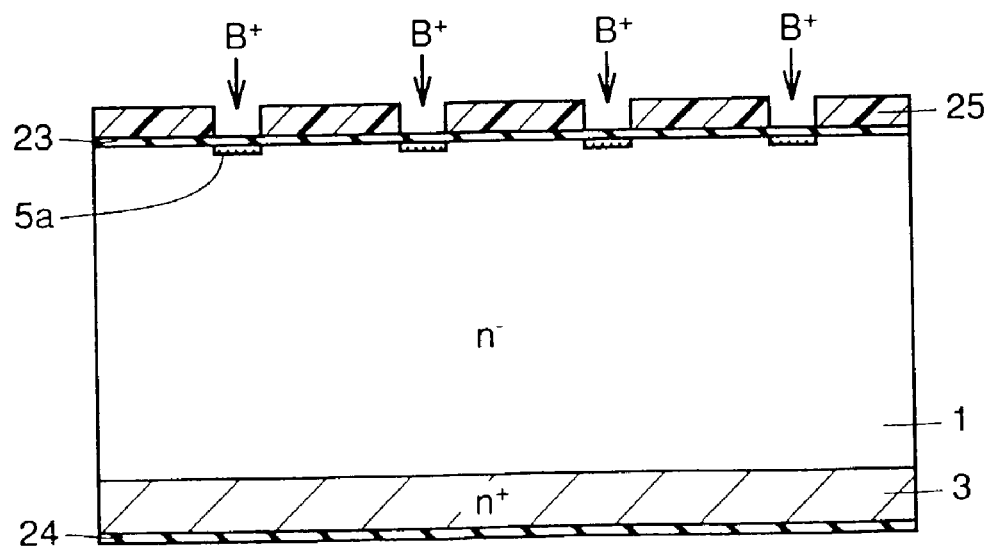

Next with reference to FIG. 12, a prescribed photoresist pattern 25 is formed on silicon oxide film 23. An impurity injection region 5a is formed by the ion implantation of a boron into n⁻ substrate 1 using photoresist pattern 25 as a mask. Photoresist pattern 25 is thereafter removed.

Figure 13:
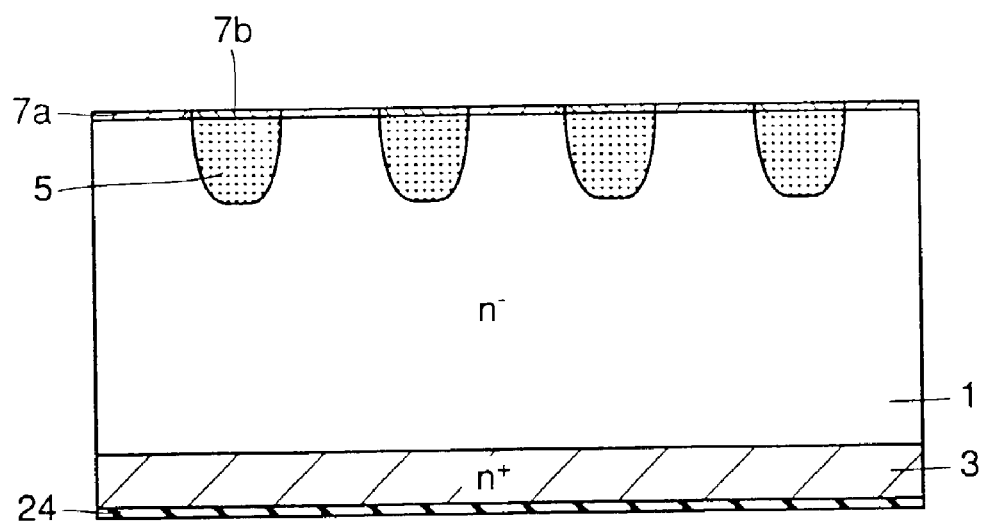

Referring to FIG. 13, p anode region 5 is formed by a prescribed heat treatment which thermally diffuses impurity injection region 5a shown in FIG. 12. Initial amount of injection of the boron and a condition of the heat treatment are selected such that an impurity concentration of p anode region 5 at the surface of n⁻ substrate 1 is ultimately $1\times10^{16}$–$1\times10^{17}/cm^3$. The silicon oxide film is removed and a platinum film is formed on n⁻ substrate 1 to cover p anode region 5 by the sputtering or the like. A platinum silicide is formed by a prescribed heat treatment by which the silicon and the platinum in n⁻ substrate 1 are reacted with each other. The platinum which does not yet react is thereafter removed. The platinum silicide film formed on p anode region 5 thereafter constitutes ohmic junction region 7b. The platinum silicide film formed on n⁻ substrate 1 thereafter constitutes Schottky junction region 7a.

Figure 14:
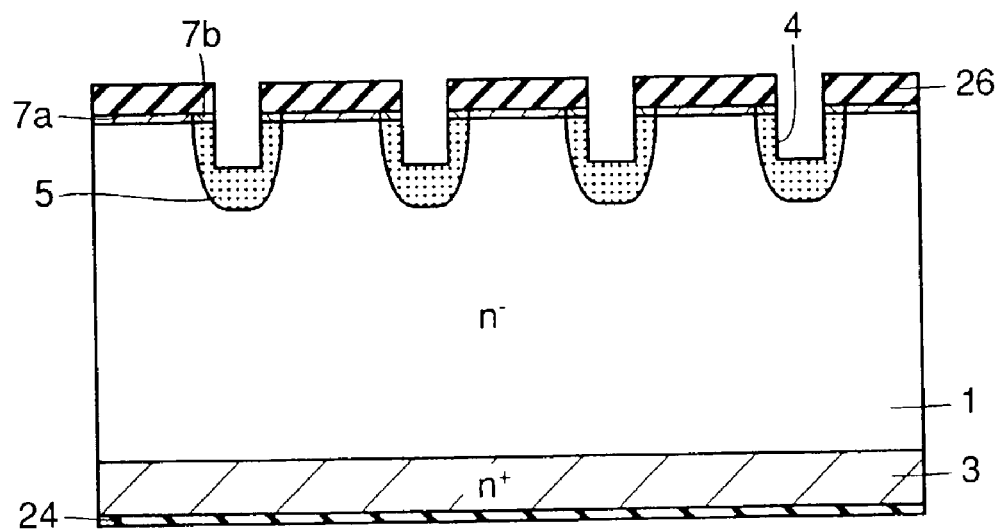

Referring to FIG. 14, a thick silicon oxide film 26 is formed on the surface of n⁻ substrate 1. The surface of p anode region 5 is exposed by the anisotropic etching of silicon oxide film 26 using a prescribed photoresist pattern (not shown) formed on silicon oxide film 26. P anode region 5 is anisotropically etched using silicon oxide film 26 as a mask and trench 4 is formed.

Figure 15:
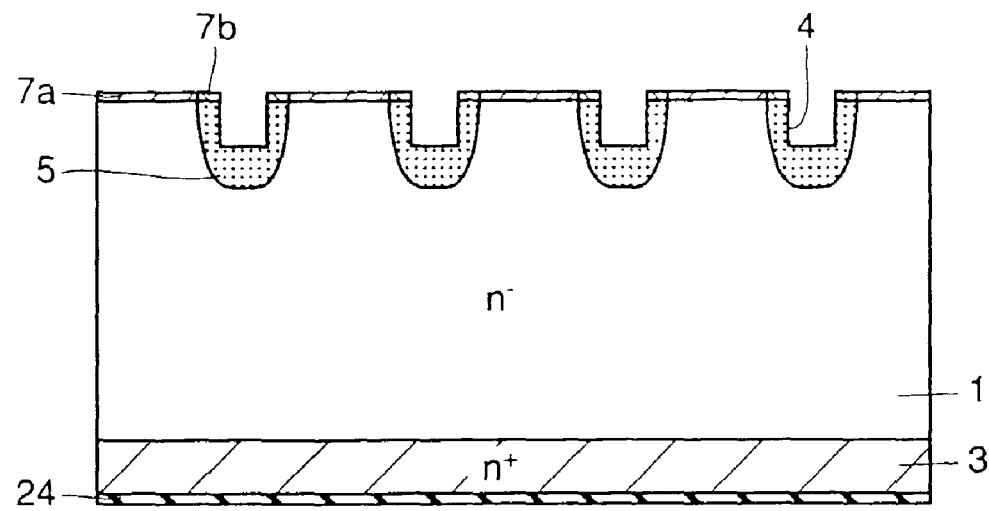

Referring to FIG. 15, silicon oxide film 26 shown in FIG. 14 is removed.

Figure 16:
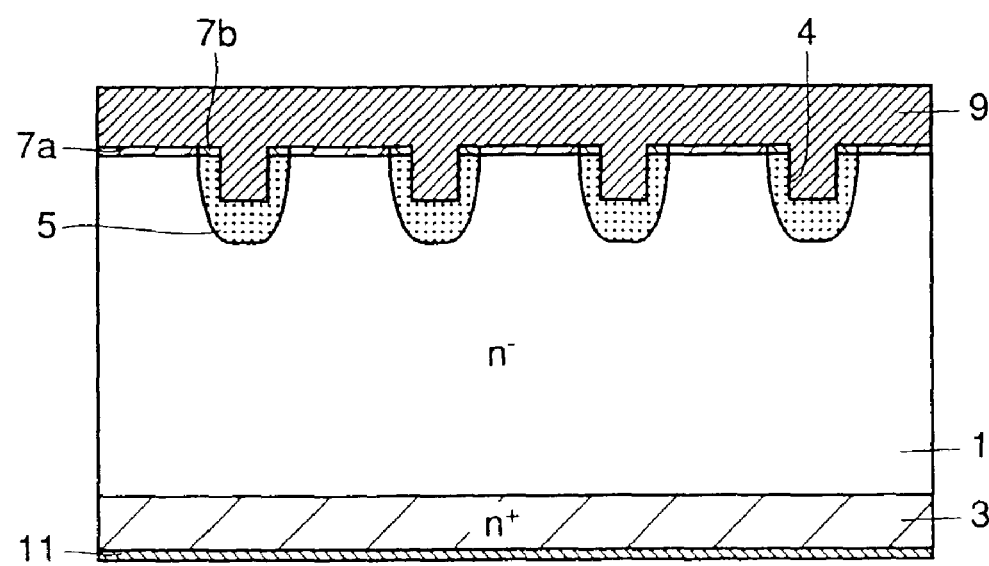

Referring to FIG. 16, anode metallic electrode 9 is formed on n⁻ substrate 1 to fill trench 4. Preferably aluminum is used for anode metallic electrode 9. Anode metallic electric 9 and p anode region 5 are in ohmic contact with each other at the surface of n⁻ substrate 1. The characteristics of the impurity distribution in p anode region 5 allow anode metallic electrode 9 to be in ohmic contact with P anode region 5 at the side of trench 4 near ohmic junction region 7b.

Removing the silicon oxide film formed at the surface of n⁺ cathode region 3, cathode metallic electrode 11 is formed. Accordingly, a diode shown in FIG. 1 is completed.

Especially in this case, each p anode region 5 is formed by first introducing the p type impurity into n⁻ substrate 1 and by the heat treatment. At the same time that the impurity is thermally diffused from the surface of n⁻ substrate 1 to the inside, the impurity is also thermally diffused at the surface of n⁻ substrate 1 toward the peripheral portions. The initial amount of introduction of the impurity, a condition of the heat treatment and the like are selected such that the impurity region at the surface of n⁻ substrate 1 has the minimum impurity concentration to enable the ohmic contact with anode metallic electrode 9. In the impurity region, the impurity concentration is highest near the center of the surface of n⁻ substrate 1, and the concentration gradually decreases toward the inside of n⁻ substrate 1. Trench 4 is formed near the center of each impurity region. In the impurity region, a region having a relatively low impurity concentration located near the interface with n⁻ substrate 1 finally becomes p anode region 5. The reverse recovery current of the diode is thus reduced as described in the first embodiment.

Ninth Embodiment

Figure 17:
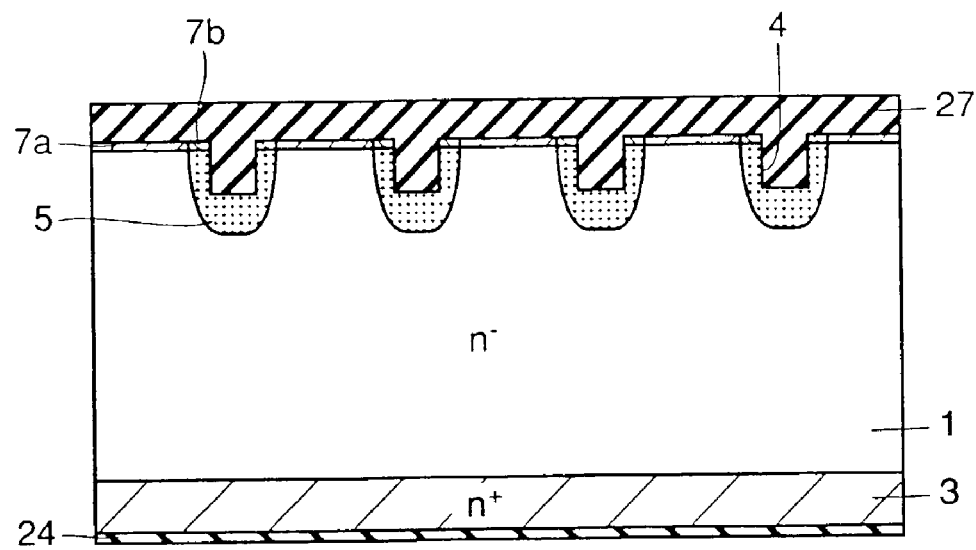
FIG. 17 is a cross section illustrating one step of a method of manufacturing a diode according to the ninth embodiment.

According to the ninth embodiment, a method of manufacturing a diode shown in FIG. 2 described in the second embodiment is described using the figures. Referring to FIG. 17, after the processes shown in FIGS. 10–15, a silicon oxide film 27 is formed on n⁻ substrate 1 to fill each trench 4.

Figure 18:
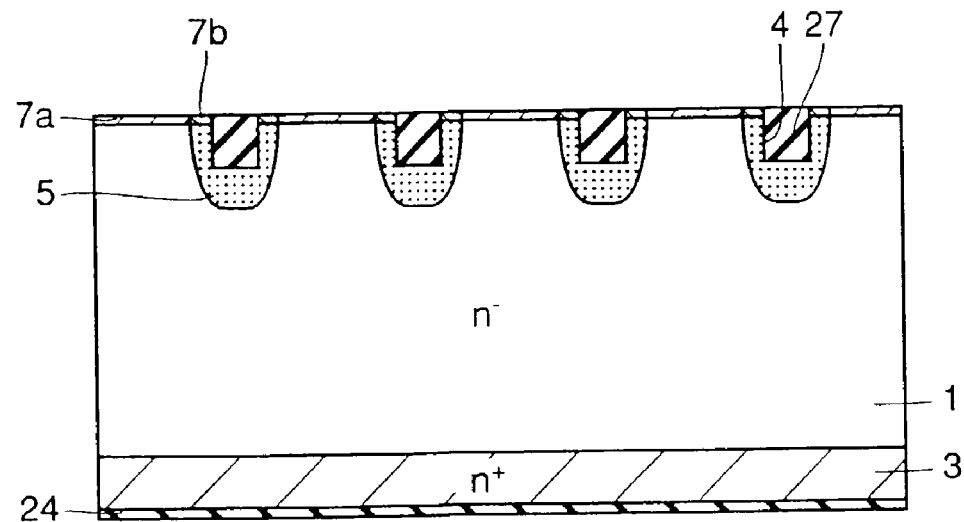
FIG. 18 is a cross section showing a step carried out after the step shown in FIG. 17 according to the ninth embodiment.

Referring to FIG. 18, the silicon oxide film is etched, and silicon oxide film 27 is left only in trench 4.

Figure 19:
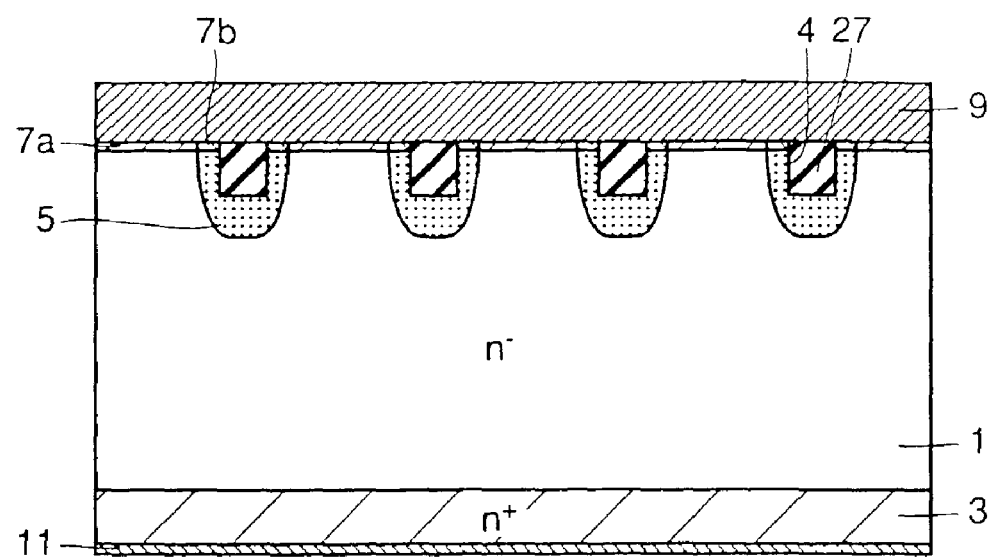
FIG. 19 is a cross section showing a step executed after the step shown in FIG. 18 according to the ninth embodiment.

Referring to FIG. 19, anode metallic electrode 9 is formed on the surface of n⁻ substrate 1. Cathode metallic electrode 11 is formed at the surface of n⁺ cathode region. In this case, anode metallic electrode 9 is in ohmic contact with p anode region 5 only in the ohmic junction region 7b since silicon oxide film 27 is embedded in trench 4. The diode shown in FIG. 2 is thus completed. The completed diode has an effect as described in the second embodiment.

Tenth Embodiment

Figure 20:
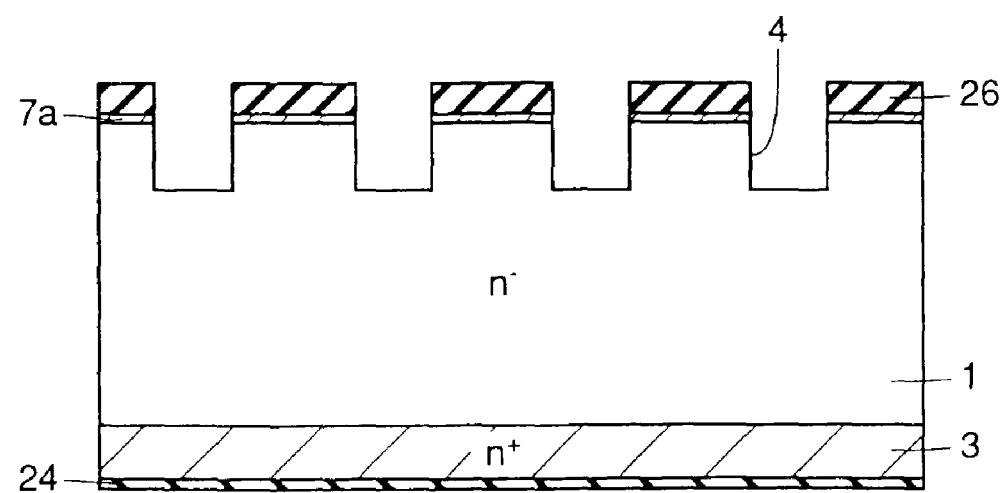
FIG. 20 is a cross section showing a step of manufacturing a diode according to the tenth embodiment.

According to the tenth embodiment, a method of manufacturing the diode shown in FIG. 4 described in the third embodiment is described using the figures. Referring to FIG. 20, a platinum silicide film which thereafter becomes Schottky junction region 7a is formed as described in the eighth embodiment at the surface of n⁻ substrate 1. A silicon oxide film 26 is formed on the platinum silicide film.

The surface of n⁻ substrate 1 is exposed by anisotropically etching silicon oxide film 26 using a prescribed photoresist pattern (not shown) formed on silicon oxide film 26 as a mask. N⁻ substrate 1 is further anisotropically etched using silicon oxide film 26 as a mask to form a plurality of trenches 4. At the other surface of n⁻ substrate 1, n⁺ cathode region 3 and silicon oxide film 24 are formed as described in the eighth embodiment.

Figure 21:
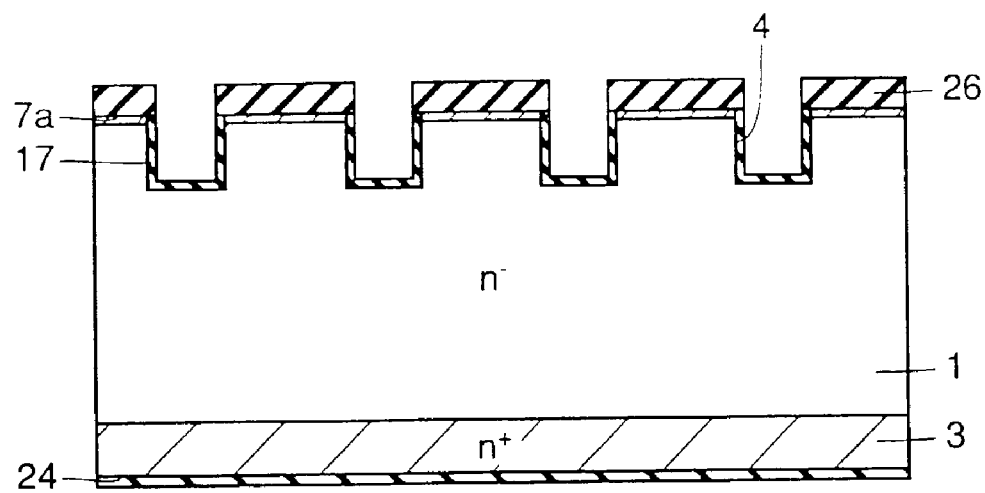
FIGS. 21–25 are cross sections respectively showing steps in the order of execution according to the tenth embodiment.

Referring to FIG. 21, surfaces of the plurality of trenches 4 are covered with silicon oxide film 17 by the thermal oxidation.

Figure 22:
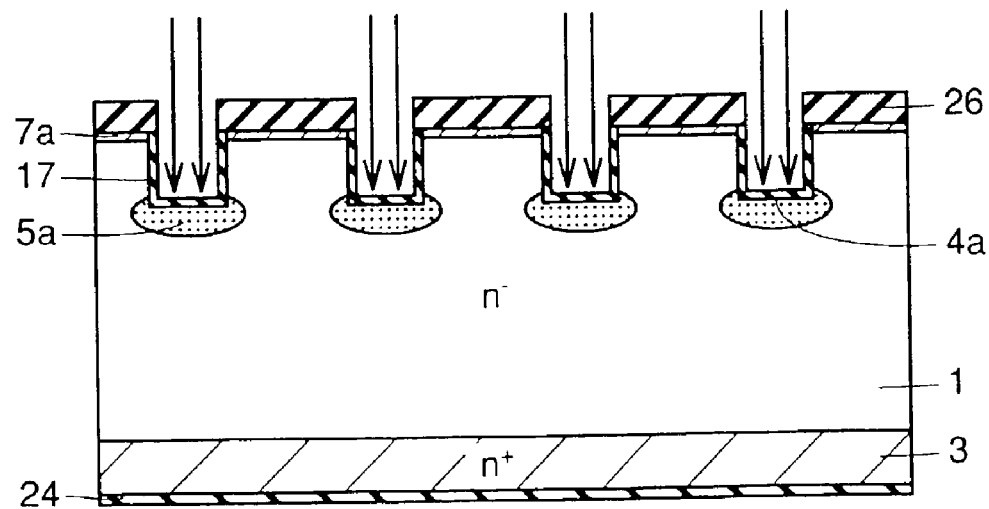

Referring to FIG. 22, using silicon oxide film 26 as a mask, the p type impurity such as boron is injected into n⁻ substrate 1 through the ion implantation, and impurity injection region 5a in contact with bottom surface of trench 4a is formed. By prescribed heat treatment, impurity injection region 5a becomes p anode region. An initial amount of injection of the boron and a condition of the heat treatment are selected such that an impurity concentration of p anode region 5 at trench bottom surface 4a is finally $1\times10^{16}$–$1\times10^{17}/cm^3$.

Figure 23:
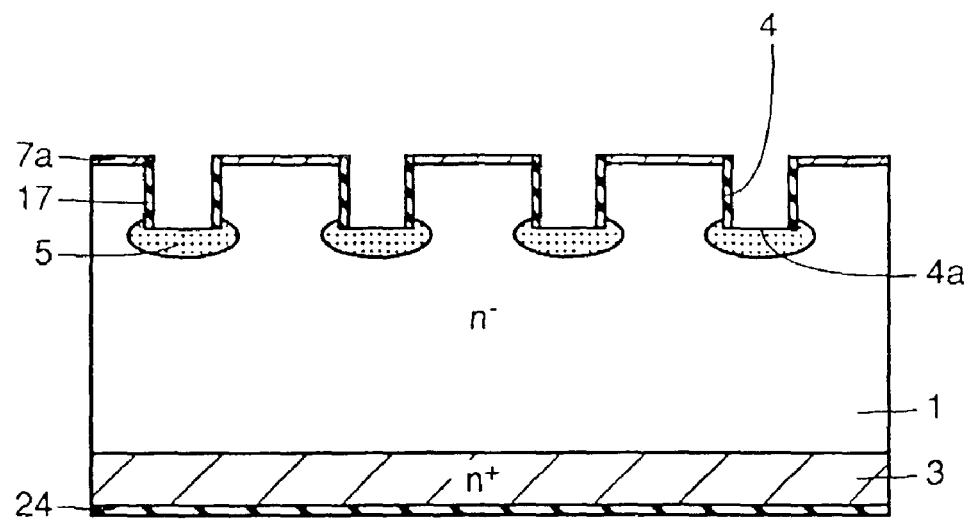

With reference to FIG. 23, silicon oxide film 26 and silicon oxide film 17 formed at trench bottom surface 4a are removed by the anisotropic etching.

Figure 24:
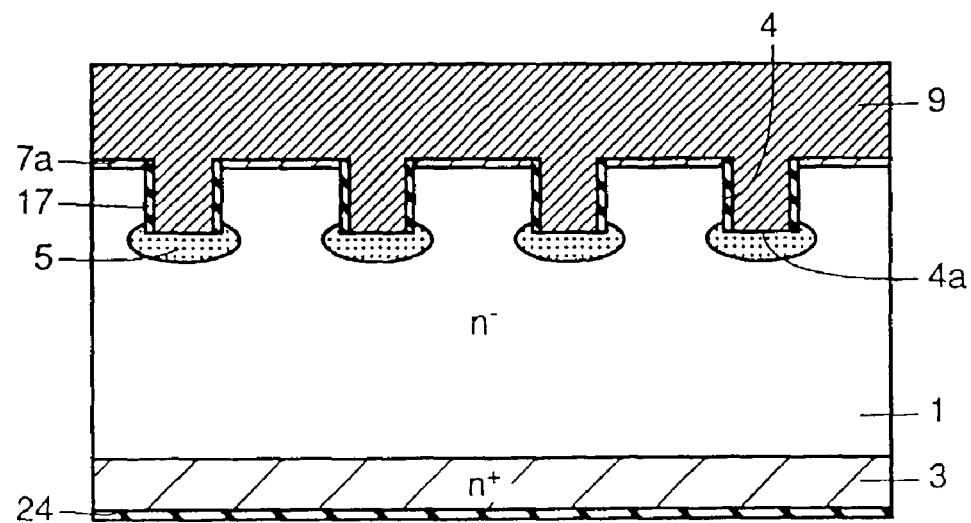

With reference to FIG. 24, anode metallic electrode 9 is formed on the surface of n⁻ substrate 1 to fill trench 4. Preferably, aluminum is used for anode metallic electrode 9. Schottky junction region 7a is located between anode metallic electrode 9 and n⁻ substrate 1. Anode metallic electrode 9 is in ohmic contact with n⁻ substrate 1 at trench bottom surface 4a.

Figure 25:
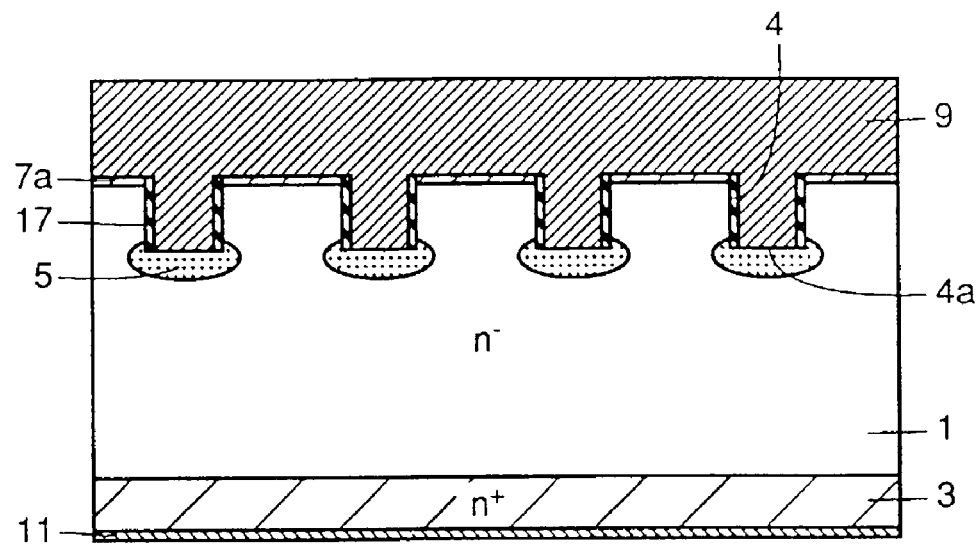

Referring to FIG. 25, cathode metallic electrode 11 is formed on the surface of n⁺ cathode region 3. The diode shown in FIG. 4 is thus completed. The completed diode has an effect as described in the third embodiment.

Eleventh Embodiment

According to the eleventh embodiment, a method of manufacturing the diode shown in FIG. 5 described in the fourth embodiment is described using the figures.

Figure 26:
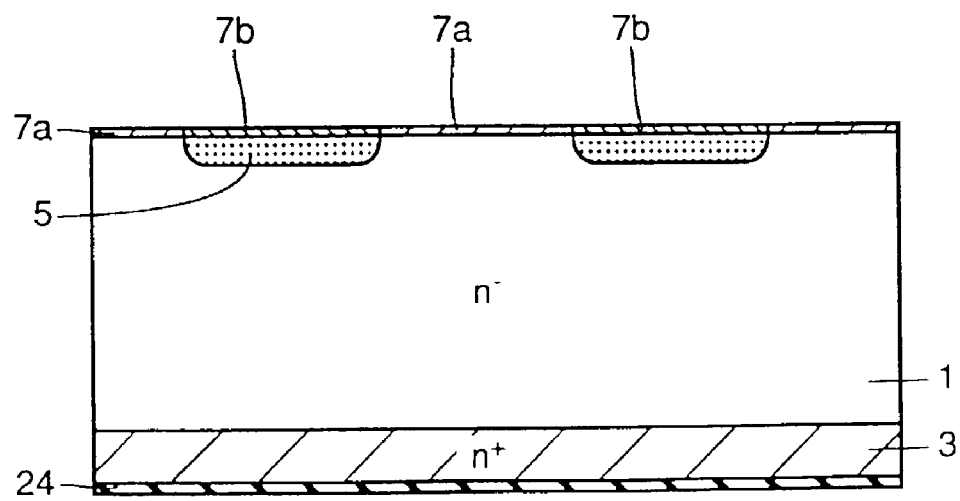
FIG. 26 is a cross section showing a step of a method of manufacturing a diode according to the eleventh embodiment of the invention.

Referring to FIG. 26, p anode region 5 is formed at a prescribed region of n⁻ substrate 1 through the processes similar to those shown in FIGS. 10–13 described in the eighth embodiment. An initial amount of injection of the boron and a condition of the heat treatment are selected such that p anode region 5 has an impurity concentration which finally becomes $1\times10^{16}$–$1\times10^{17}/cm^3$ at the surface of n⁻ substrate 1.

Figure 27:
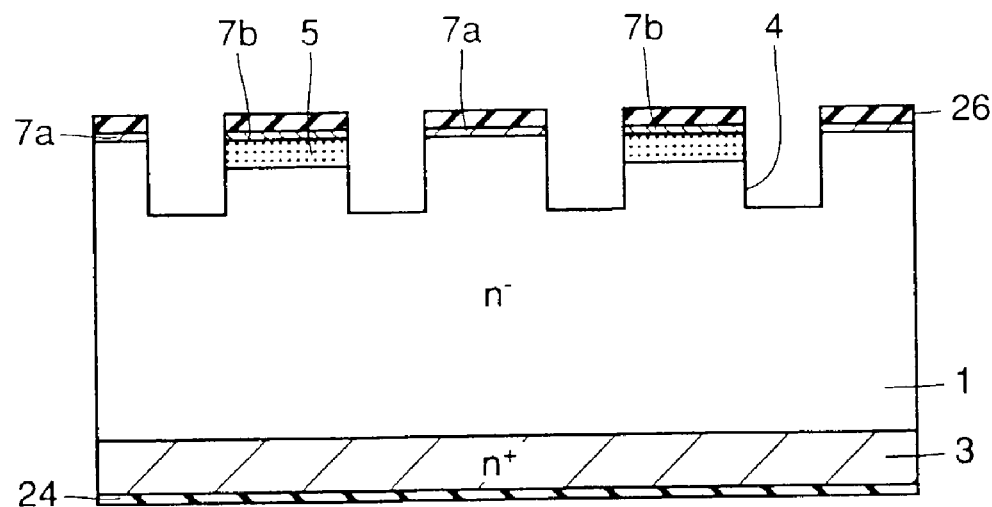
FIGS. 27–32 are cross sections respectively showing steps in the order of execution according to the eleventh embodiment.

Referring to FIG. 27, a silicon oxide film 26 is formed on n⁻ substrate 1. Silicon oxide film 26 is anisotropically etched using a prescribed photoresist pattern (not shown) formed on silicon oxide film 26 as a mask, and the surface of n⁻ substrate 1 is exposed. A plurality of trenches 4 are formed by anisotropically etching n⁻ substrate 1 using silicon oxide film 26 as a mask. At every other region sandwiched between trenches 4, p anode region 5 is located.

Figure 28:
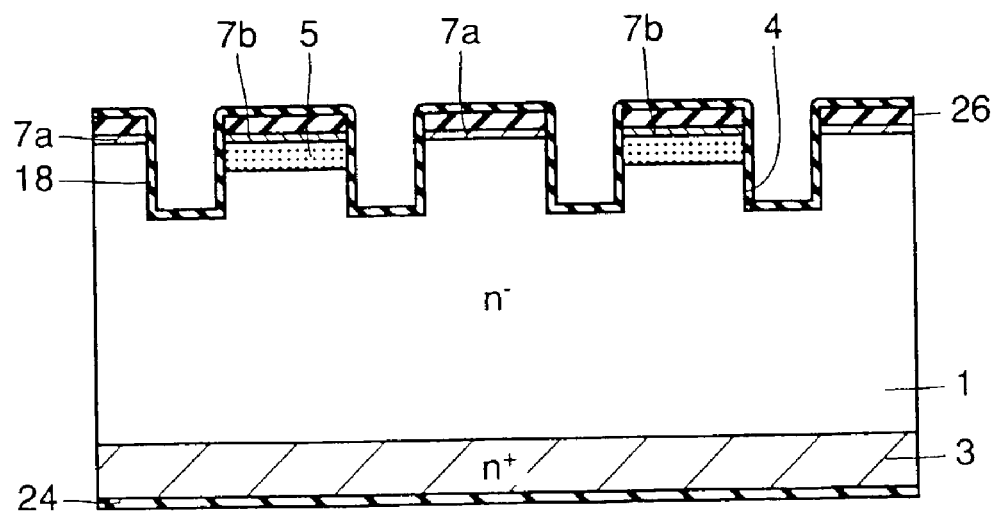

Referring to FIG. 28, silicon oxide film 18 which covers the surface of each trench 4 is formed by the thermal oxidation or the like.

Figure 29:
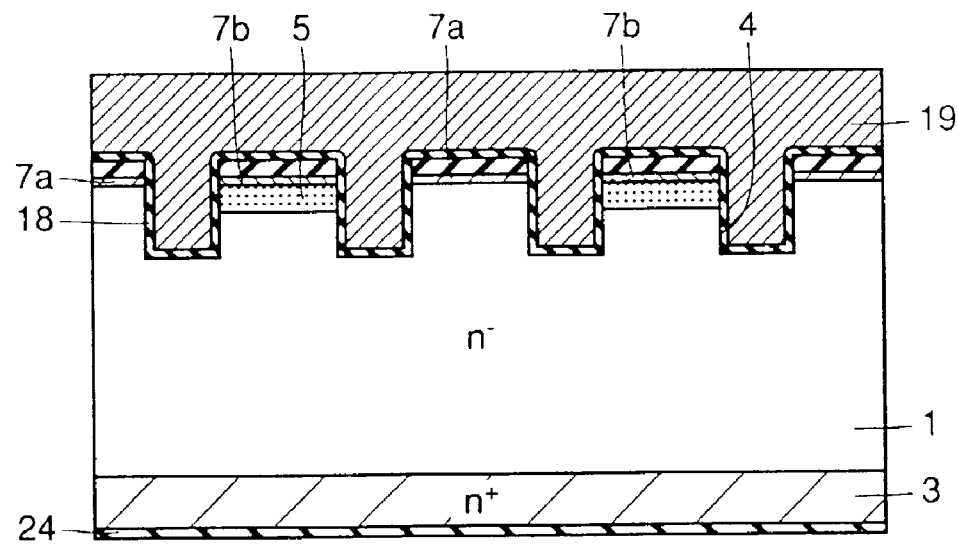

Next with reference to FIG. 29, doped polysilicon film 19 is formed to fill each trench 4.

Figure 30:
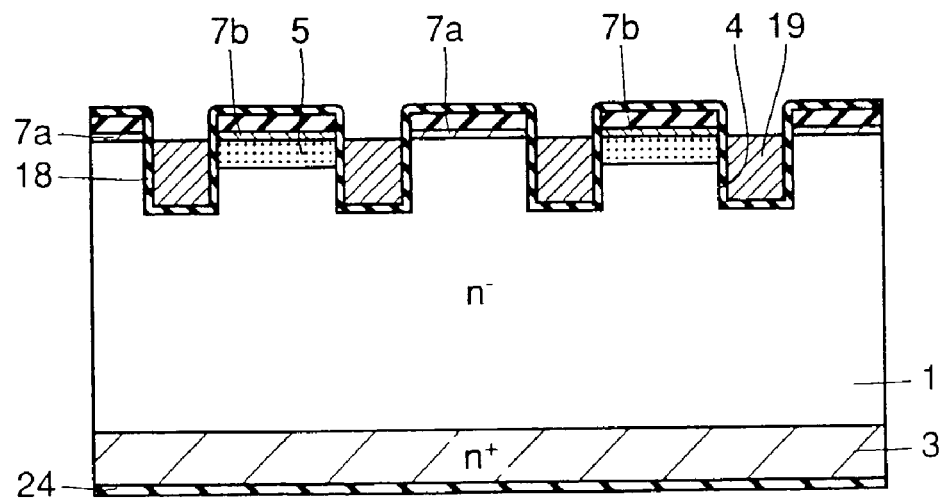

Referring to FIG. 30, doped polysilicon film 19 is etched to leave doped polysilicon film 19 in each trench 4.

Figure 31:
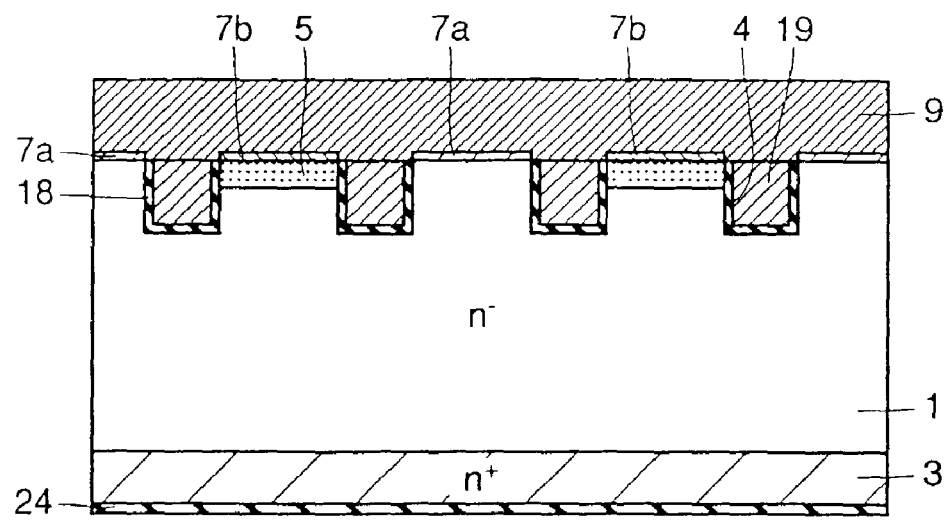

Referring to FIG. 31, silicon oxide films 26 and 18 shown in FIG. 30 are removed. Anode metallic electrode 9 is thereafter formed on n⁻ substrate 1. Preferably, aluminum is used for anode metallic electrode 9. Schottky junction region 7a is located between anode metallic electrode 9 and n⁻ substrate 1. Between anode metallic electrode 9 and p anode region 5, ohmic junction region 7b is located.

Figure 32:
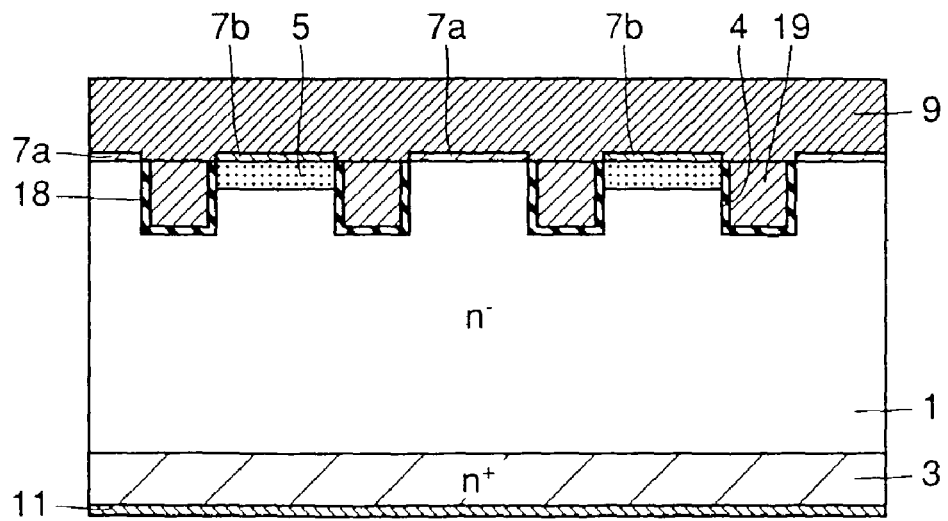

With reference to FIG. 32, cathode metallic electrode 11 is formed on the surface of n⁺ cathode region 3. The diode shown in FIG. 5 is thus completed. The completed diode has an effect as described in the fourth embodiment.

Twelfth Embodiment

Figure 33:
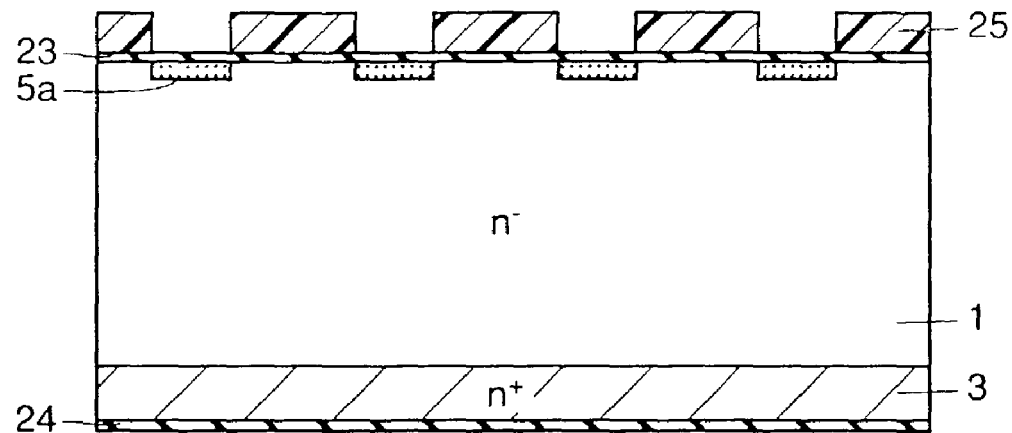
FIG. 33 is a cross section showing a step of a method of manufacturing a diode according to the twelfth embodiment.

According to the twelfth embodiment, a method of manufacturing the diode shown in FIG. 7 described in the fifth embodiment is described using the figures. Referring to FIG. 33, through the processes similar to those shown in FIGS. 10–12 described in the eighth embodiment, impurity injection region 5a is formed at the surface of n⁻ substrate 1. The p anode region is formed by the heat treatment. An initial amount of injection of the boron and a condition of the heat treatment are selected such that an impurity concentration of the p anode region finally becomes $1 \times 10^{16} - 1 \times 10^{17}/cm^3$ at the surface of n⁻ substrate 1.

Figure 34:
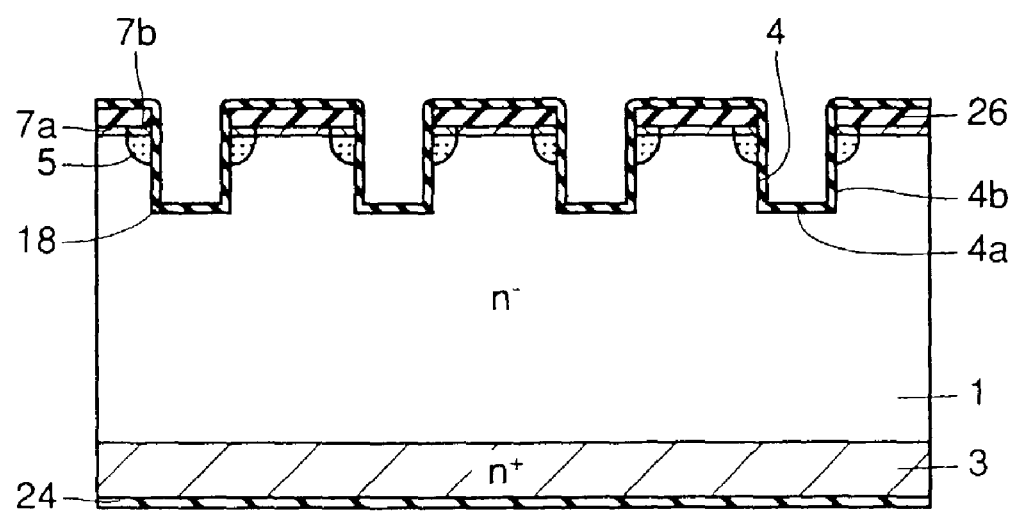
FIGS. 34–37 are cross sections respectively showing steps in the order of execution according to the twelfth embodiment.

Referring to FIG. 34, a plurality of trenches 4 are formed at the surface of n⁻ substrate 1 through the processes similar to those shown in FIGS. 14 and 15 described in the eighth embodiment. Each trench 4 is formed to be at a deeper portion than p anode region 5. The surface of each trench 4 is thereafter covered with silicon oxide film 18 by the thermal oxidation or the like.

Figure 35:
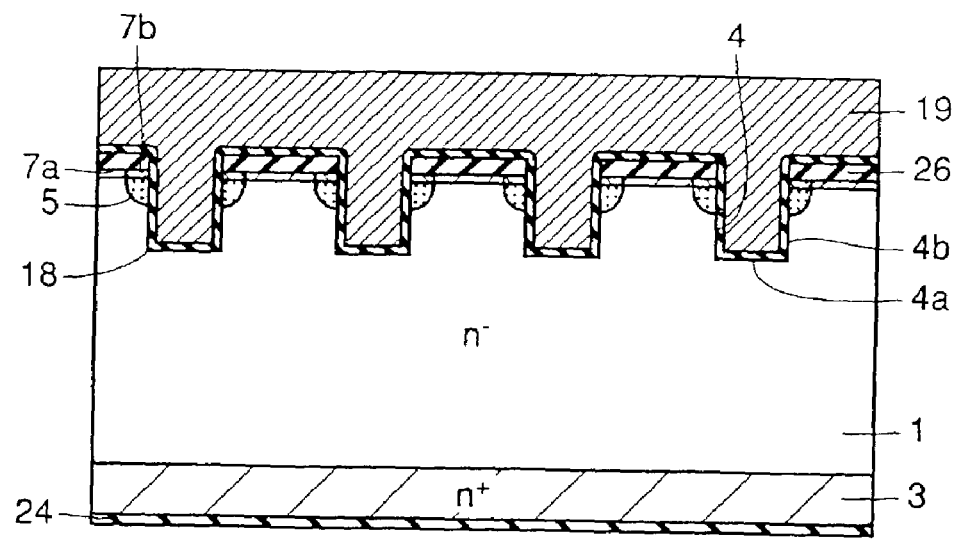

With reference to FIG. 35, doped polysilicon film 19 is formed to fill each trench 4.

Figure 36:
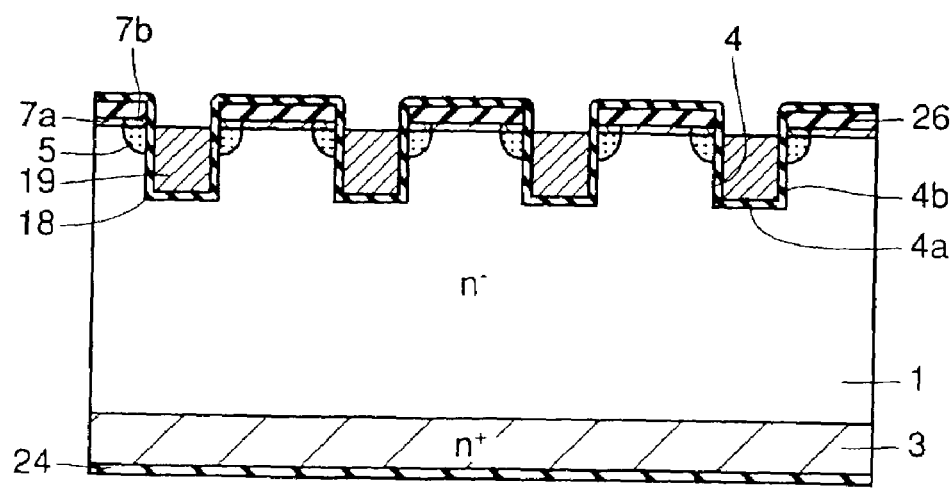

Referring to FIG. 36, the doped polysilicon film is etched to leave doped polysilicon film 19 in each trench 4. Silicon oxide films 26 and 18 that are exposed on n⁻ substrate 1 are removed.

Figure 37:
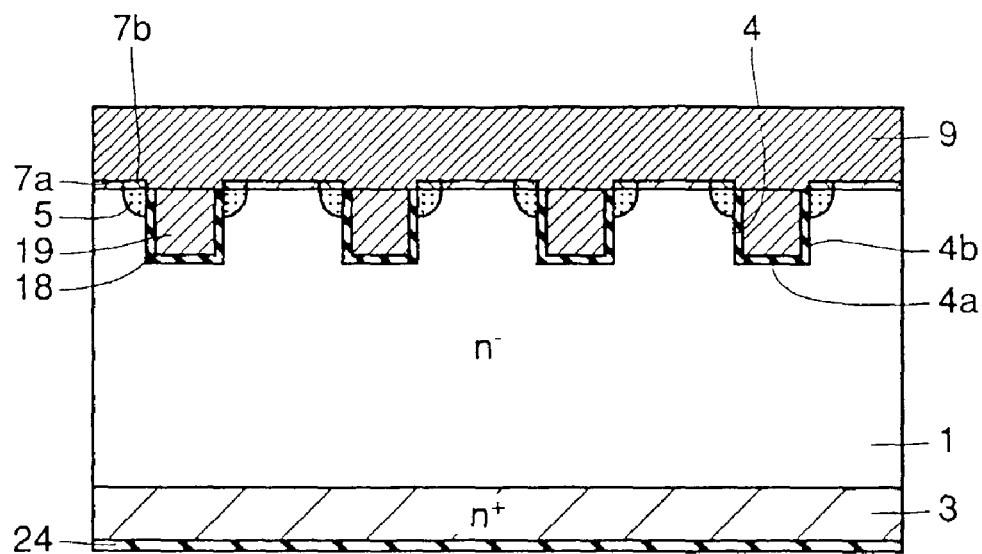

Referring to FIG. 37, anode metallic electrode 9 is formed on n⁻ substrate 1. Preferably, aluminum is used for anode metallic electrode 9. Schottky junction region 7a is located between anode metallic electrode 9 and n⁻ substrate 1. Between anode metallic electrode 9 and p anode region 5, ohmic junction region 7b is located.

The diode shown in FIG. 7 is completed after the cathode metallic electric is formed on the surface of n⁺ cathode region 3. The completed diode has an effect as described in the fifth embodiment.

Thirteenth Embodiment

According to the thirteenth embodiment, a method of manufacturing the diode shown in FIG. 8 described in the sixth embodiment is described using the figures.

Figure 38:
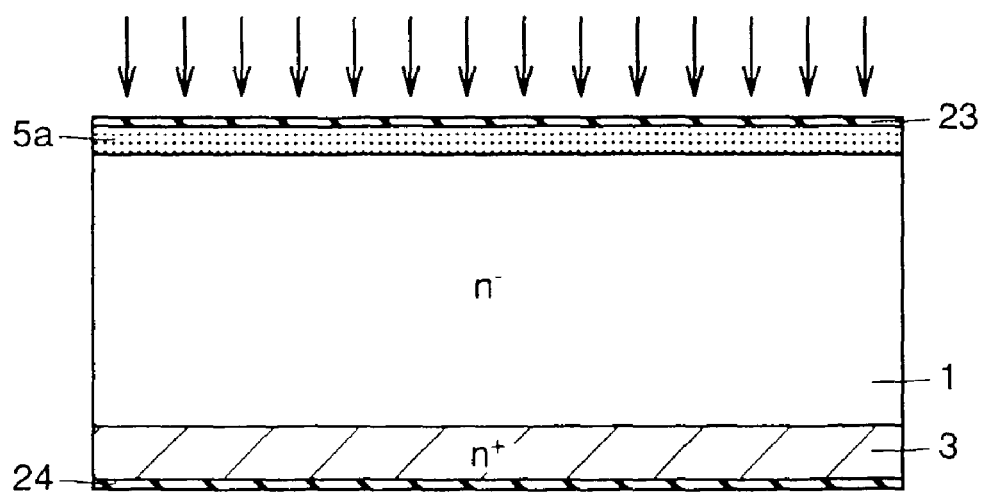
FIG. 38 is a cross section showing a step of a method of manufacturing a diode according to the thirteenth embodiment.

Referring to FIG. 38, after the process shown in FIG. 11 described in the eighth embodiment, impurity injection region 5a is formed by injecting the p type impurity such as the boron into the surface of n⁻ substrate 1 through the ion implantation. The p anode region is formed through a prescribed heat treatment. An initial amount of injection of the boron as well as a condition of the heat treatment are selected such that an impurity concentration of the p anode region finally becomes $1 \times 10^{16} - 1 \times 10^{17}/cm^3$ at the surface of n⁻ substrate 1.

Figure 39:
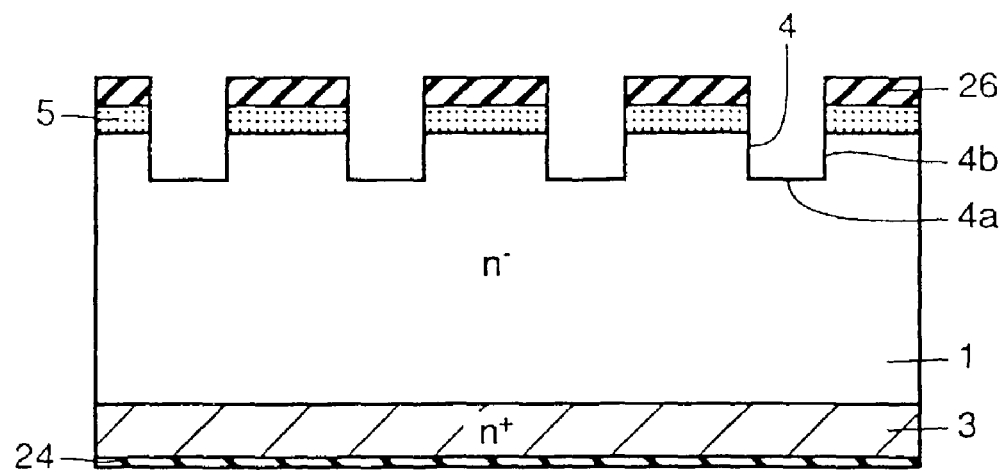
FIGS. 39–46 are cross sections respectively showing steps in the order of execution according to the thirteenth embodiment.

Referring to FIG. 39, still thicker silicon oxide film 26 is formed on p anode region 5a shown in FIG. 38. The surface of p anode region 5 is exposed by anisotropically etching silicon oxide film 26 using a prescribed photoresist pattern (not shown) formed on silicon oxide film 26 as a mask. N⁻ substrate 1 is anisotropically etched using silicon oxide film 26 as a mask, and a plurality of trenches 4 deeper than p anode region 5 are formed. Silicon oxide film 26 is thereafter removed.

Figure 40:
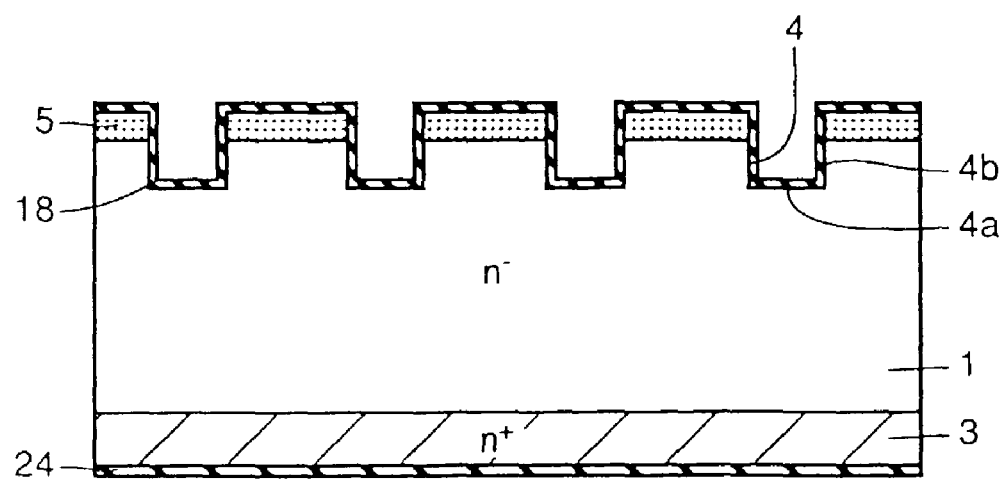

With reference to FIG. 40, the surface of each trench 4 is covered with silicon oxide film 18 by the thermal oxidation or the like.

Figure 41:
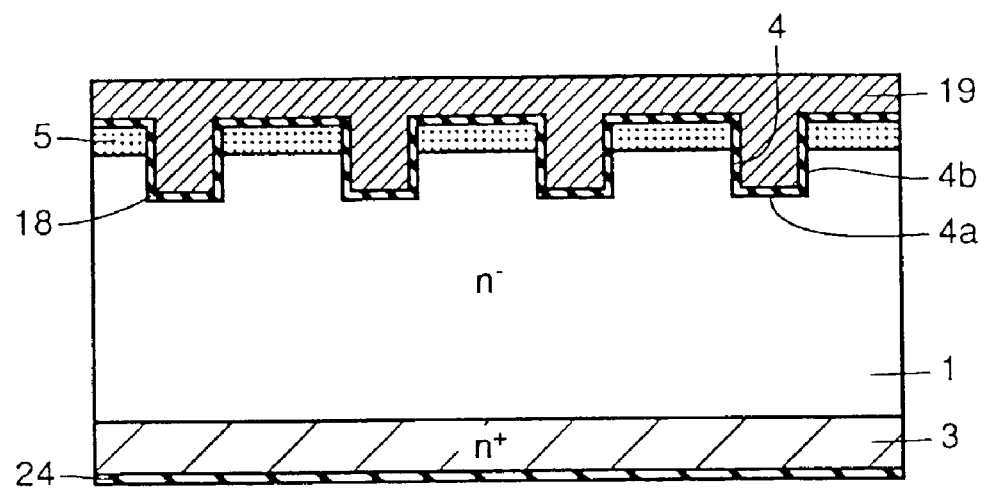

Referring to FIG. 41, doped polysilicon film 19 is formed to fill each trench 4.

Figure 42:
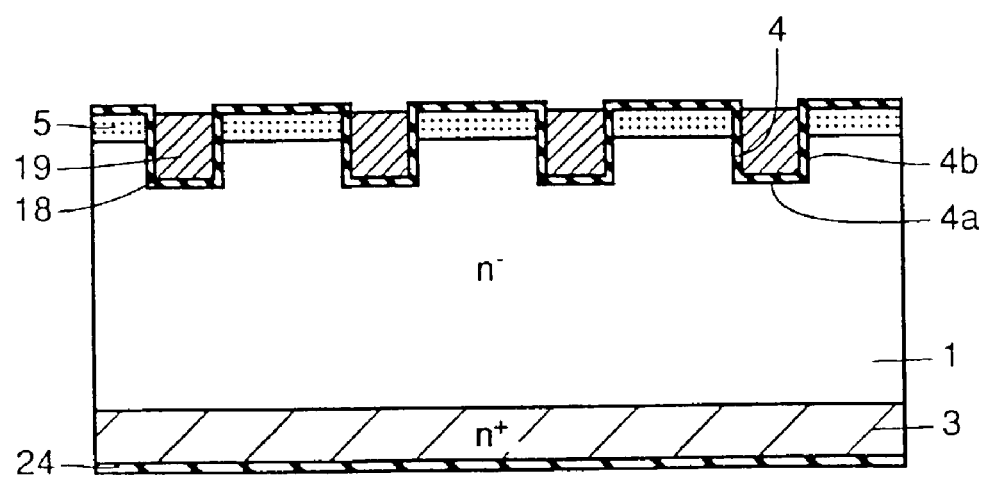

Referring to FIG. 42, the doped polysilicon film is etched to leave doped polysilicon film 19 in each trench 4.

Figure 43:
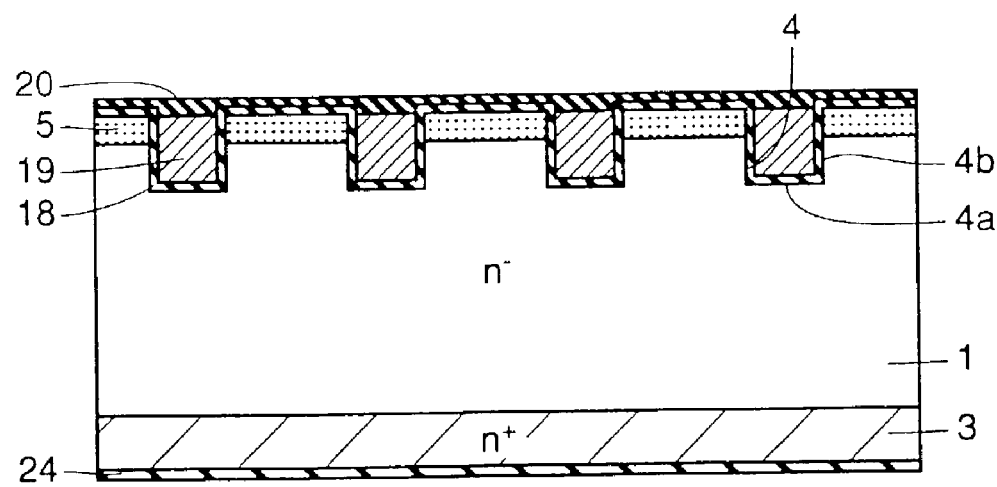

Referring to FIG. 43, silicon oxide film 20 is formed to cover doped polysilicon film 19 remaining in each trench 4.

Figure 44:
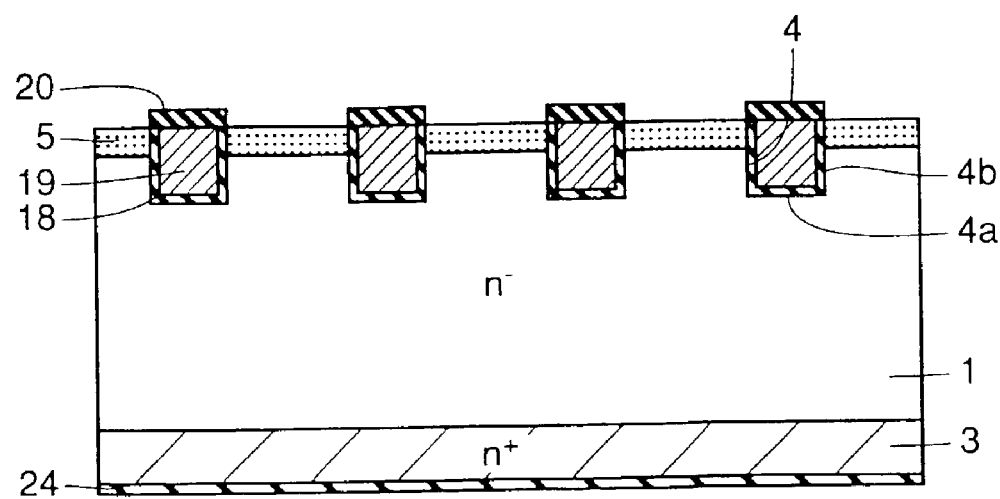

Referring to FIG. 44, silicon oxide film 20 is anisotropically etched using a prescribed photoresist pattern (not shown) formed on silicon oxide film 20 as a mask, the silicon oxide film on doped polysilicon film 19 is left, and the silicon oxide film on p anode region 5 is removed.

Figure 45:
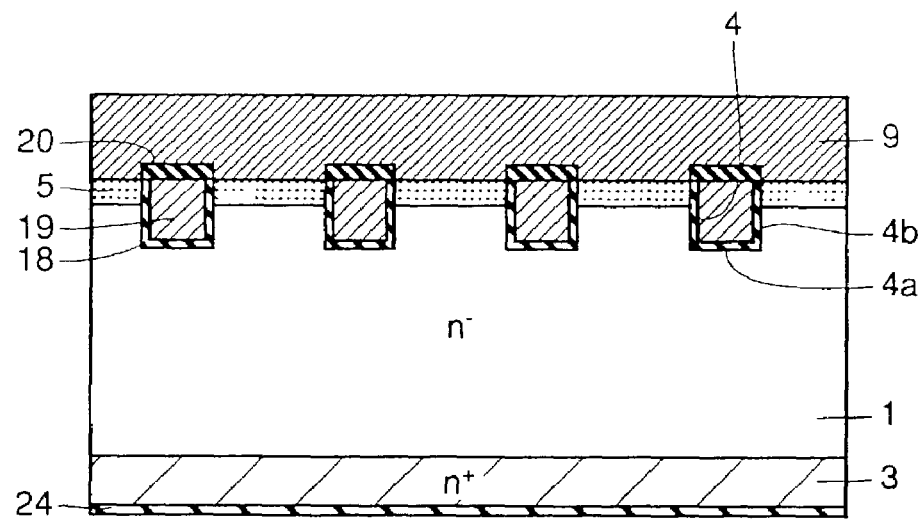

Referring to FIG. 45, anode metallic electrode 9 is formed on the surface of n⁻ substrate 1 to cover the remaining silicon oxide film 20.

Figure 46:
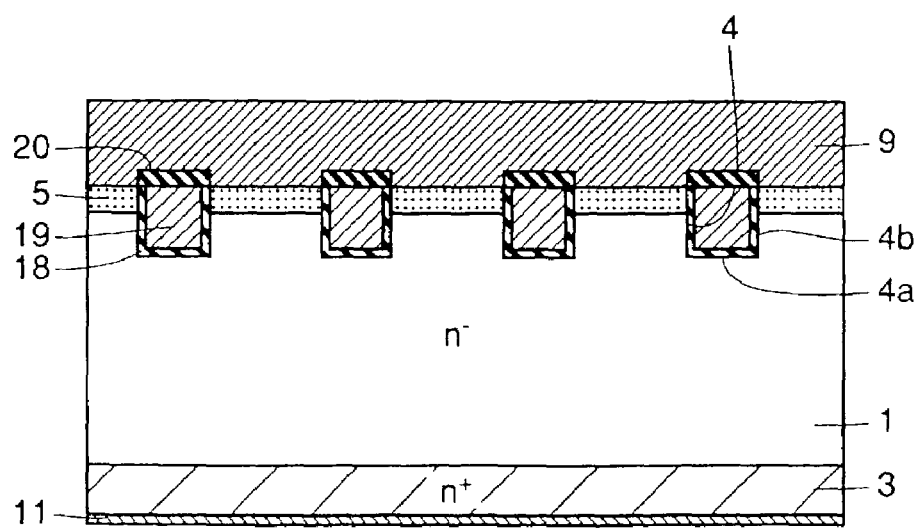

With reference to FIG. 46 next, cathode metallic electrode 11 is formed on the surface of n⁺ cathode region 3. The diode shown in FIG. 8 is thus completed. The completed diode has an effect described in the sixth embodiment.

Fourteenth Embodiment

Figure 47:
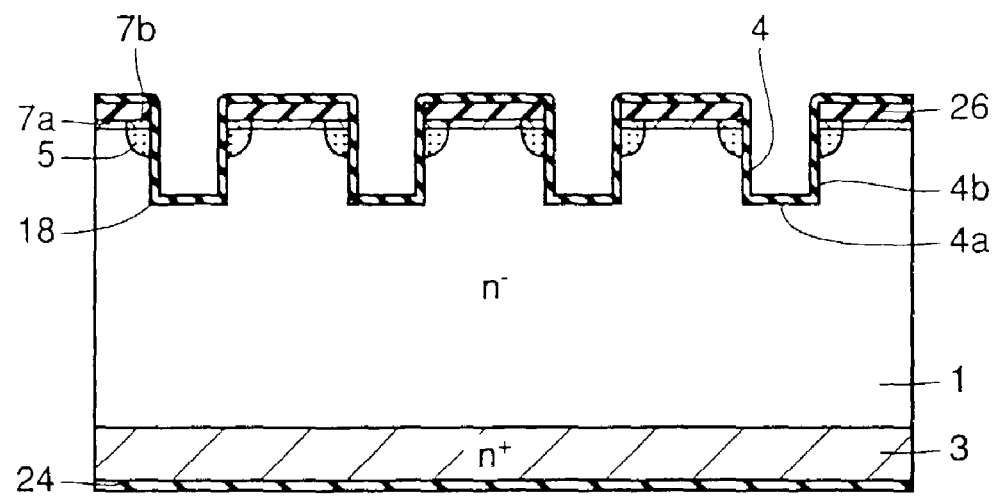
FIG. 47 is a cross section showing one step of a method of manufacturing a diode according to the fourteenth embodiment.

According to the fourteenth embodiment, a method of manufacturing the diode shown in FIG. 9 described in the seventh embodiment is described using the figures. First with reference to FIG. 47, after the processes similar to those shown in FIGS. 33 and 34 described in the twelfth embodiment, a plurality of trenches 4 are formed at the surface of n⁻ substrate 1. The surface of each trench 4 is covered with silicon oxide film 18 by the thermal oxidation method or the like.

Figure 48:
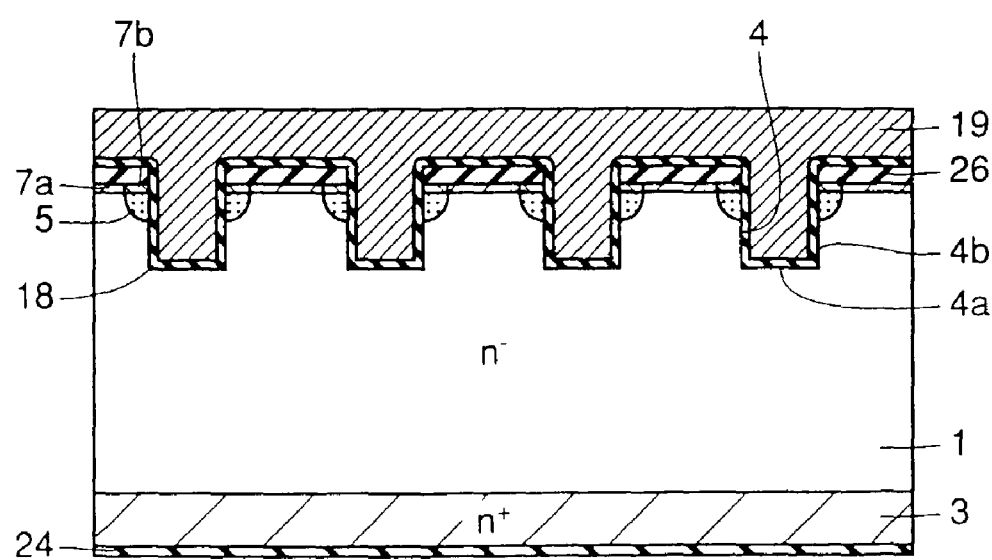
FIGS. 48–53 are cross sections respectively showing steps in the order of execution according to the fourteenth embodiment.

Referring to FIG. 48, doped polysilicon film 19 is formed to fill each trench 4.

Figure 49:
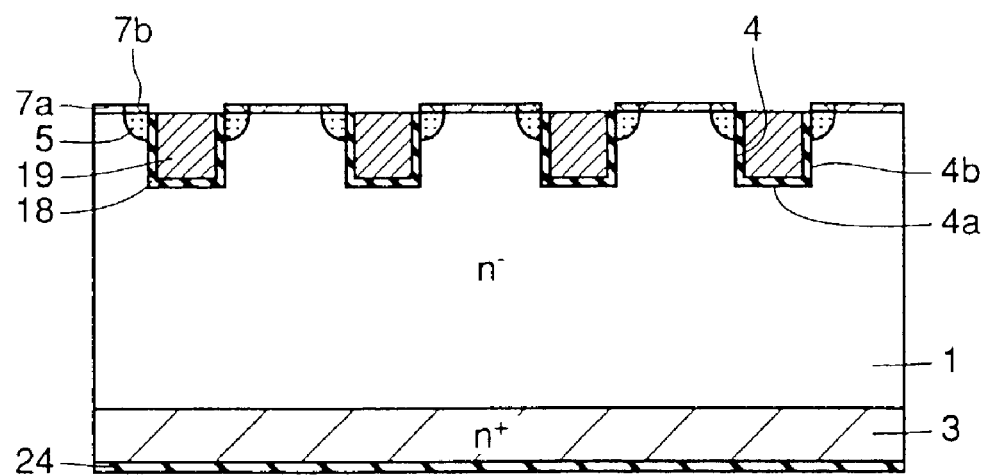

Referring to FIG. 49, by etching the doped polysilicon film, doped polysilicon film 19 is left in each trench 4, and a region for forming a gate outgoing electrode (not shown) that becomes a gate outgoing electrode in the later step is left in each trench 4. Those portions of silicon oxide films 26 and 18 shown in FIG. 48 located on the surface of n⁻ substrate 1 are removed.

Figure 50:
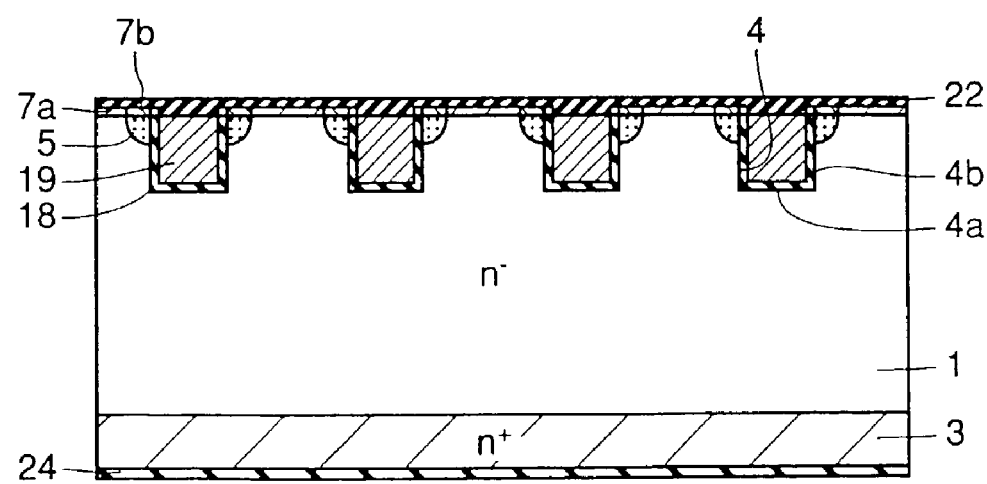

Referring to FIG. 50, silicon oxide film 22 is formed to cover doped polysilicon film 19 remaining in each trench 4.

Figure 51:
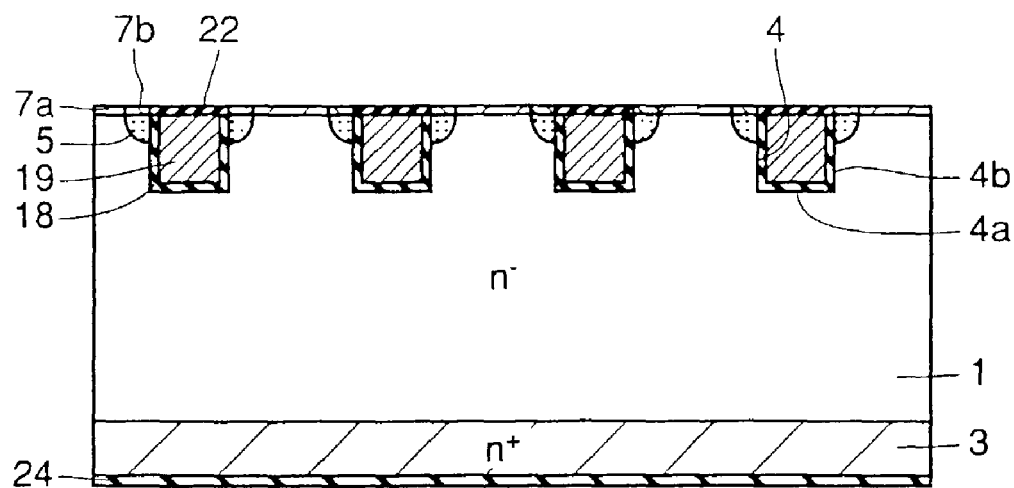

Next with reference to FIG. 51, the silicon oxide film is selectively etched.

Figure 52:
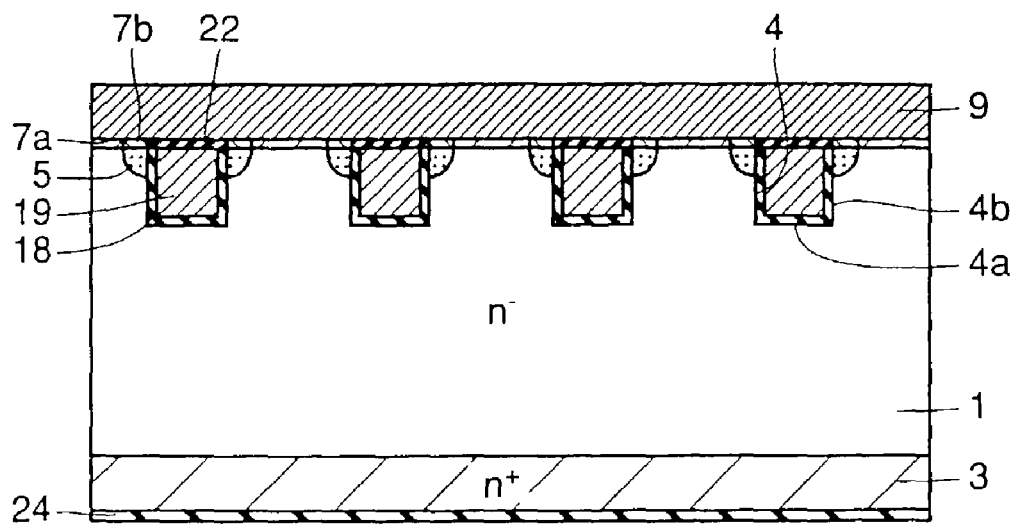

Next with reference to FIG. 52, anode metallic electrode 9 is formed on n⁻ substrate 1 to cover silicon oxide film 22.

Figure 53:
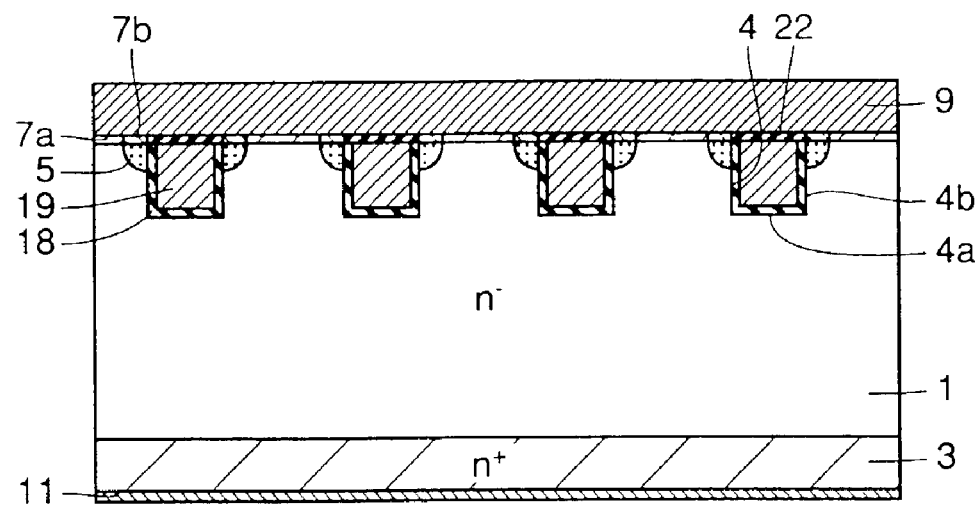
Figure 54:
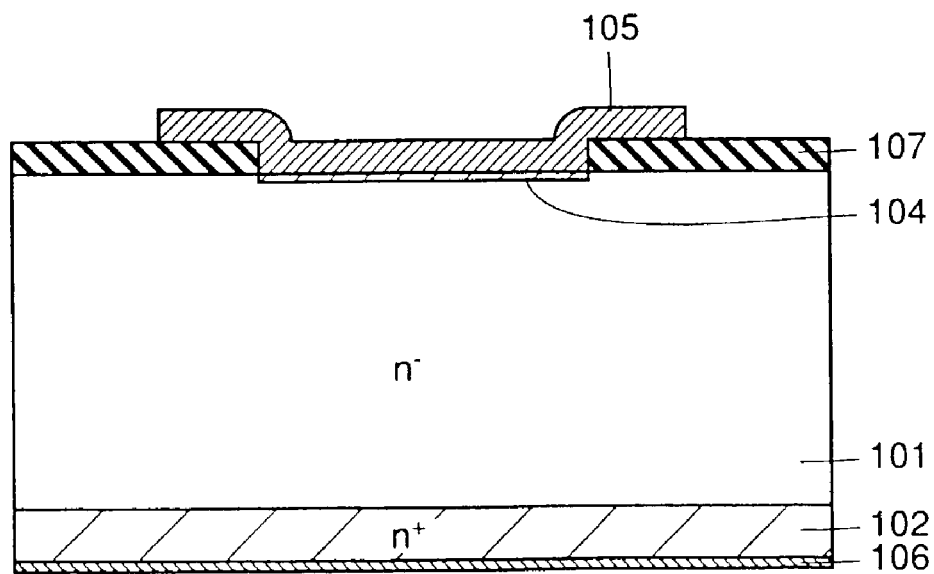
FIG. 54 is a cross section of a diode having the conventional Schottky junction region.
Figure 55:
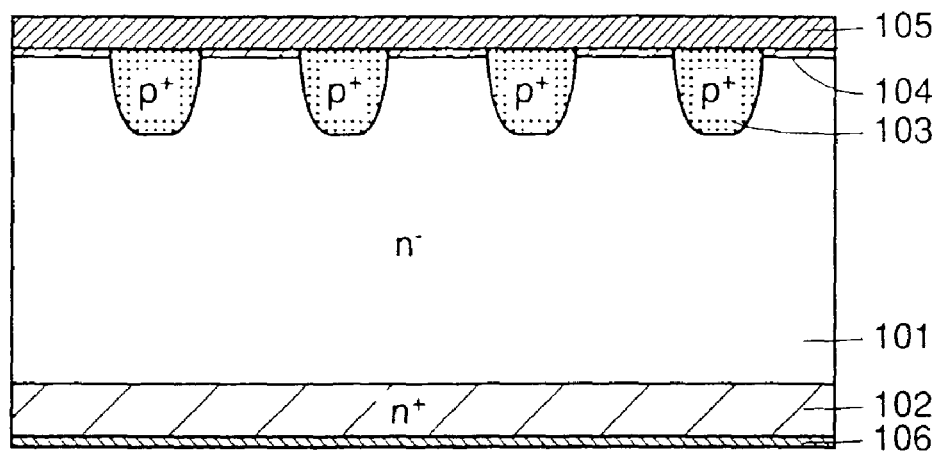
FIGS. 55–59 are cross sections respectively showing diodes of the first to the fifth conventional arts.
Figure 56:
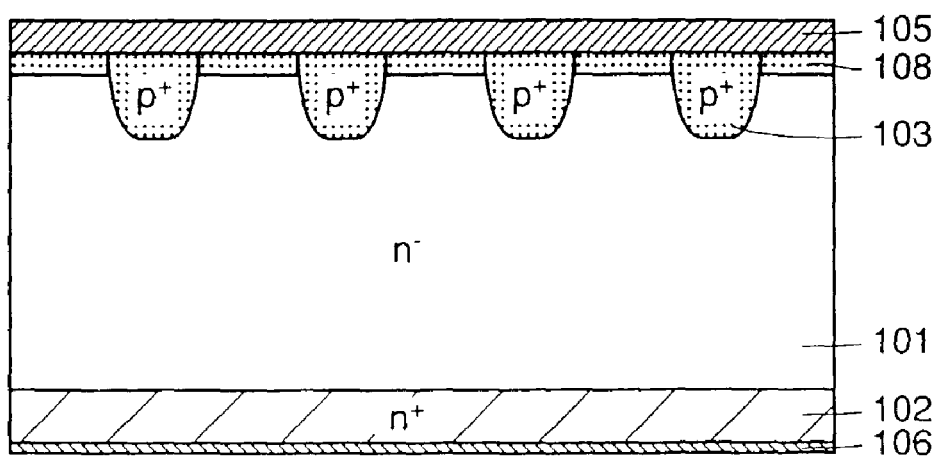
Figure 57:
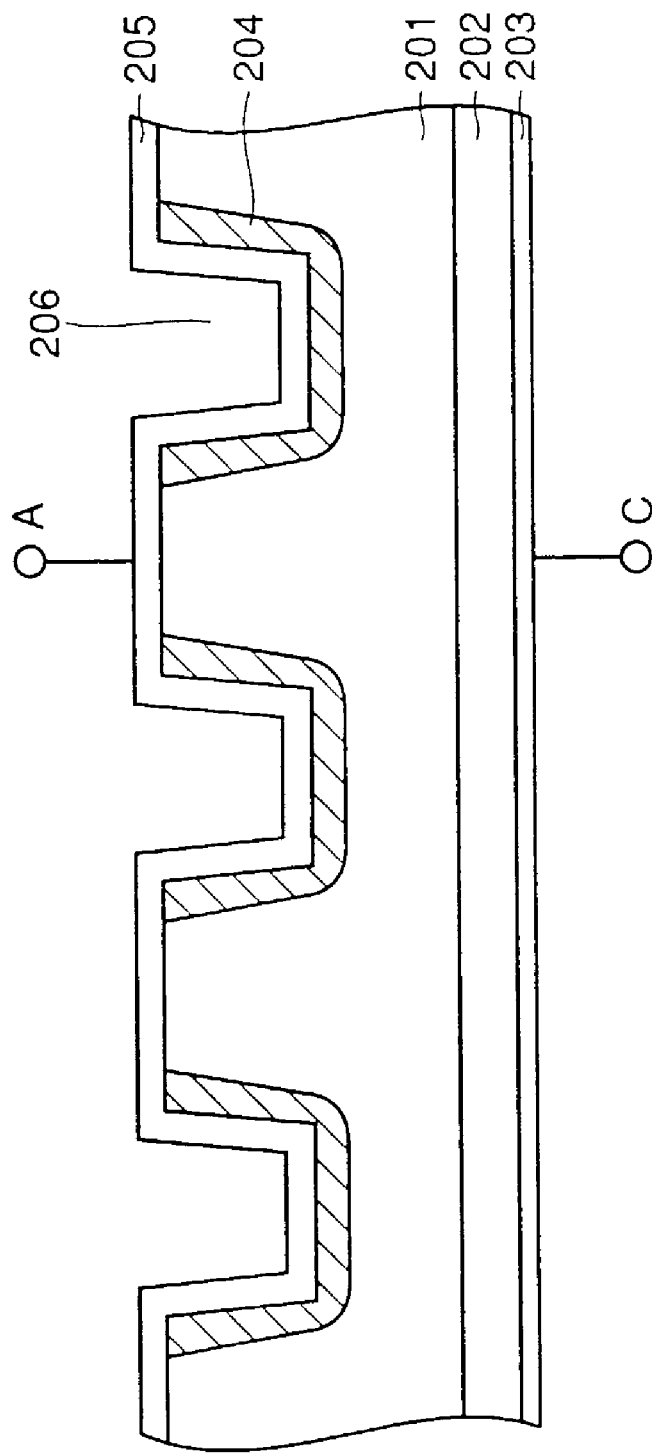
Figure 58:
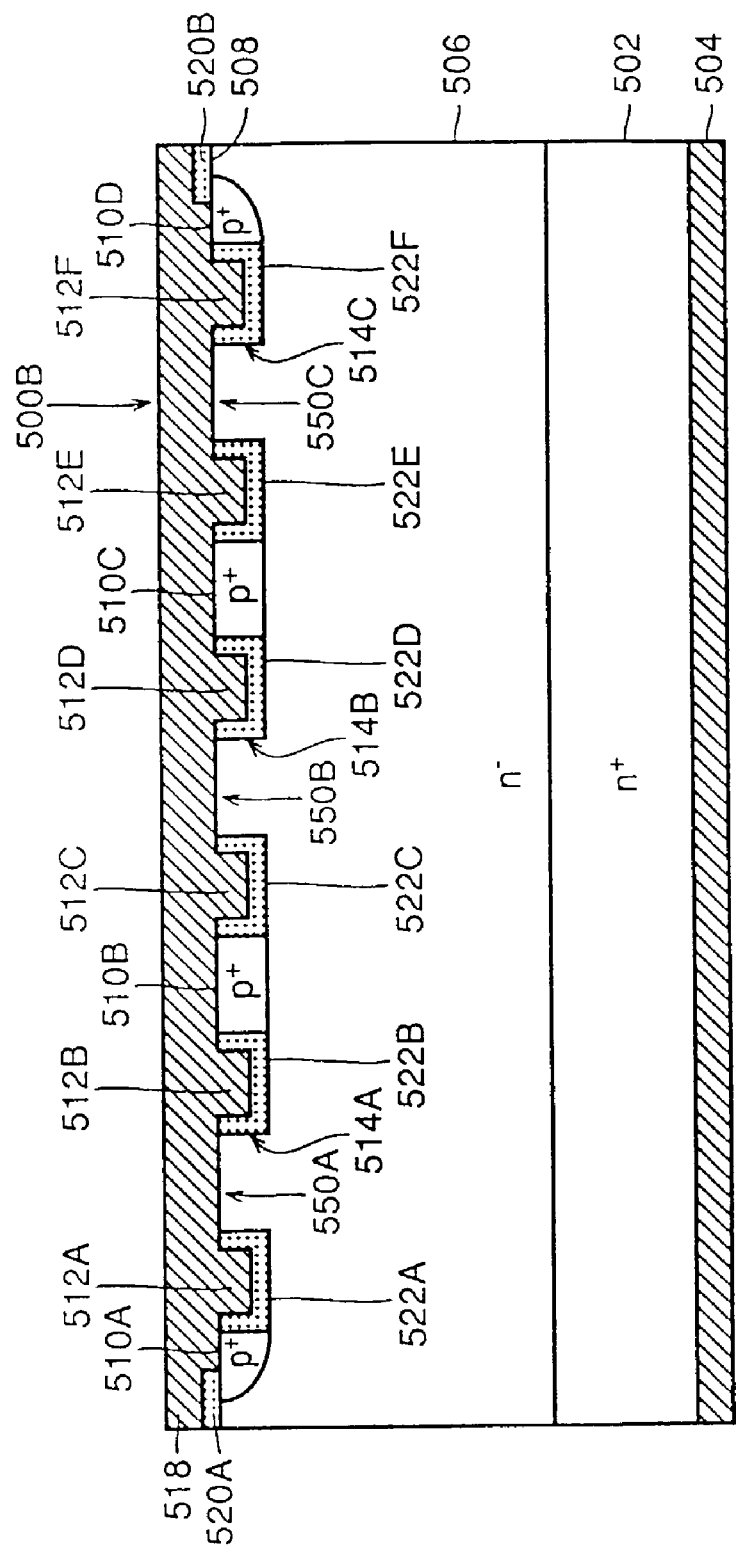
Figure 59:
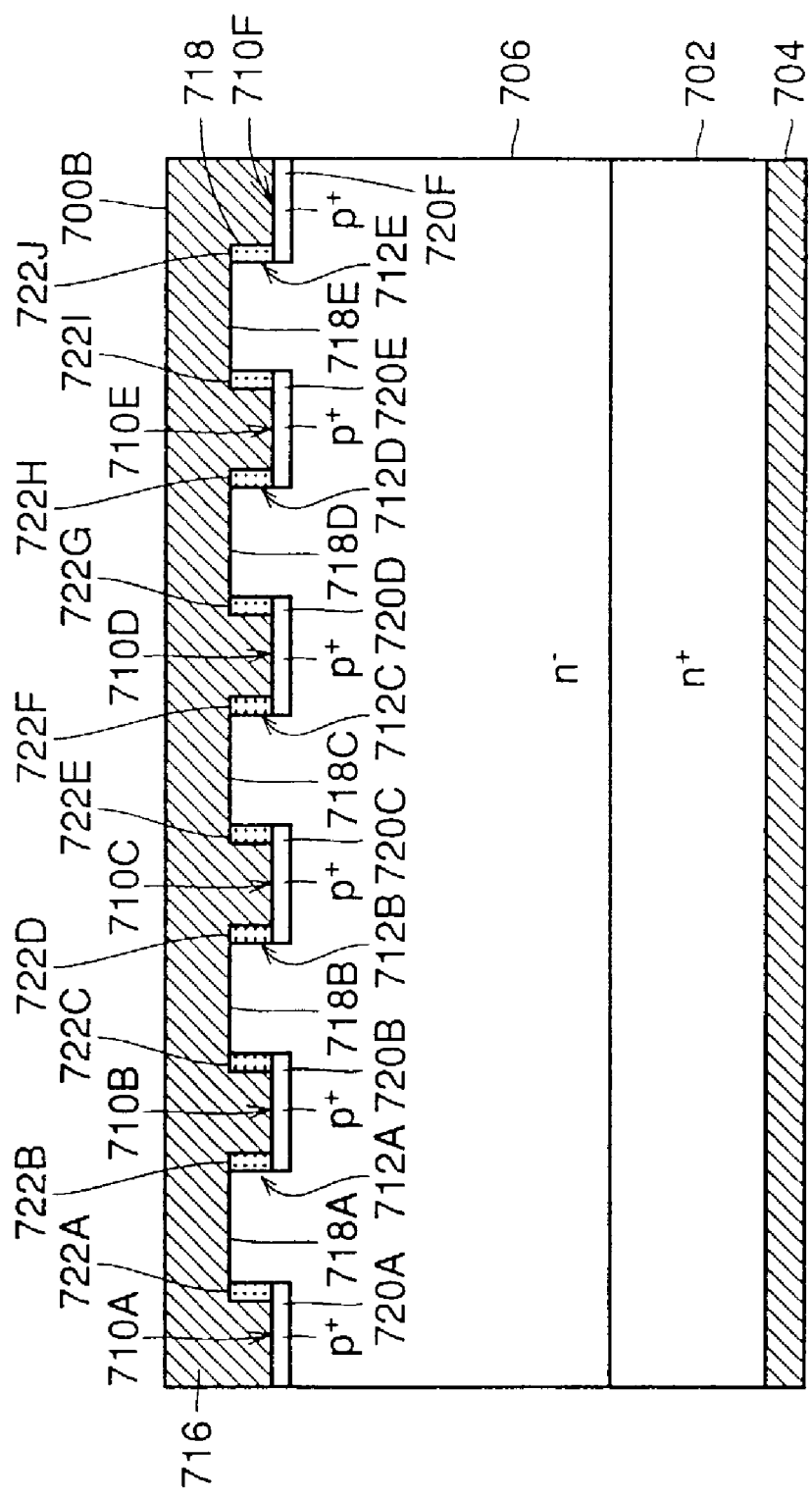

Referring to FIG. 53 next, cathode metallic electrode 11 is formed on the surface of n⁺ cathode region 3. Doped polysilicon films 19 embedded in respective trenches 4 are electrically connected with each other, and constitute a gate outgoing electrode (not shown). The diode shown in FIG. 9 is thus completed. The completed diode has an effect as described in the seventh embodiment.

In each embodiment above, description is given using a diode as a semiconductor device as an example. The structure of the side of the anode metallic electrode in each diode, that is, the structure including n⁻ substrate 1, a plurality of trenches 4, p anode region 5, Schottky junction region 7a, and ohmic junction region 7b can be applied to the anode structure of the thyristor as well as the collector structure of the IGBT, and not limited to the diode.

Although the n⁻ substrate is used in this invention, a similar effect can be obtained if a p⁻ substrate is used. if the p⁻ substrate is used, the structure described above is applied to the structure at the side of the cathode in the diode and thyristor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of a first conductivity type;
    a plurality of trench portions selectively formed at a first main surface of said semiconductor substrate;
    a conductor embedded in each said trench portion with a first insulating layer there between;
    a plurality of impurity regions of a second conductivity type which is formed at a region between said trench portions and at said first main surface of said semiconductor substrate, in contact with at least one of opposite sides of adjacent trench portions and located shallower than said trench portion; and
    a first electrode layer formed on said first main surface of said semiconductor substrate, wherein;
    said first electrode layer and each said impurity region form an ohmic contact at said first main surface;
    each said impurity region has a minimum impurity concentration at a portion near said first main surface which enables ohmic contact with said first electrode layer, and has an impurity concentration still lower than said minimum impurity concentration which enables ohmic contact at a portion at said first main surface other than the portion near said first main surface;
    each said impurity region of the second conductivity type is in contact with at least the edge along the opening of the trench portion and the side, adjacent to the edge, of the trench portion, and each said impurity region of the second conductivity type is in direct contact with the semiconductor substrate of the first conductivity type; and
    each said impurity region is formed to be in contact with opposite sides of said trench portions adjacent to each other, and said first electrode layer and a region of the first conductivity type of said semiconductor substrate form a Schottky junction at said first main surface.

2. The semiconductor device according to claim 1, wherein
    said first electrode layer is formed of aluminum, and
    said minimum impurity concentration which enables ohmic contact with said first electrode layer is $1\times10^{16}$–$1\times10^{17}/cm^3$.

3. The semiconductor device according to claim 1, wherein
    each said impurity region is formed at both sides of each said trench portion to be in contact with one side of each said trench portion, and
    said first electrode layer and a region of the first conductivity type of said semiconductor substrate form a Schottky junction at said first main surface.

4. The semiconductor device according to claim 3, further comprising:
    a second insulating layer formed on each said conductor and electrically insulates said first electrode layer from each said conductor; and
    an electrode portion electrically connected with each said conductor.

5. The semiconductor device according to claim 3, wherein
    said first electrode layer is formed of aluminum, and said minimum impurity concentration which enables ohmic contact with said first electrode layer is $1\times10^{16}$–$1\times10^{17}/cm^3$.

6. The semiconductor device according to claim 1, wherein
    said impurity region is formed to be in contact with opposite sides of said trench portions adjacent to each other, and further comprising:
    a second insulating layer formed on each said conductor and electrically insulates said first electrode layer from each said conductor; and
    an electrode portion electrically connected with each said conductor.

7. The semiconductor device according to claim 6, wherein
    said first electrode layer is formed of aluminum, and said minimum impurity concentration which enables ohmic contact with said first electrode layer is $1\times10^{16}$–$1\times10^{17}/cm^3$.

8. The semiconductor device according to claim 1, wherein
    said first electrode layer is formed of aluminum, and said minimum impurity concentration which enables ohmic contact with said first electrode layer is $1\times10^{16}$–$1\times10^{17}/cm^3$.

* * * * *